United States Patent
Song

(10) Patent No.: US 11,322,515 B2
(45) Date of Patent: May 3, 2022

(54) THREE-DIMENSIONAL SEMICONDUCTOR DEVICES

(71) Applicant: Samsung Electronics Co., Ltd., Suwon-si (KR)

(72) Inventor: Juhak Song, Hwaseong-si (KR)

(73) Assignee: Samsung Electronics Co, Ltd.

( * ) Notice: Subject to any disclaimer, the term of this patent is extended or adjusted under 35 U.S.C. 154(b) by 0 days.

(21) Appl. No.: 16/826,677

(22) Filed: Mar. 23, 2020

(65) Prior Publication Data

US 2021/0020657 A1 Jan. 21, 2021

(30) Foreign Application Priority Data

Jul. 15, 2019 (KR) .................. 10-2019-0085255

(51) Int. Cl.
| | |
|---|---|
| *H01L 27/11582* | (2017.01) |
| *H01L 27/11519* | (2017.01) |
| *H01L 27/11556* | (2017.01) |
| *H01L 23/528* | (2006.01) |
| *H01L 27/11565* | (2017.01) |
| *H01L 23/522* | (2006.01) |

(52) U.S. Cl.
CPC ...... *H01L 27/11582* (2013.01); *H01L 23/528* (2013.01); *H01L 23/5226* (2013.01); *H01L 27/11519* (2013.01); *H01L 27/11556* (2013.01); *H01L 27/11565* (2013.01)

(58) Field of Classification Search
CPC ......... H01L 27/11582; H01L 27/11519; H01L 27/11556; H01L 27/11565; H01L 27/11575; H01L 27/0207; H01L 27/1157; H01L 27/11573; H01L 23/528; G06F 30/00

See application file for complete search history.

(56) References Cited

U.S. PATENT DOCUMENTS

| | | | |
|---|---|---|---|
| 9,306,041 | B2 | 4/2016 | Hwang et al. |
| 9,324,730 | B2 | 4/2016 | Nam et al. |
| 9,530,789 | B2 | 12/2016 | Lee et al. |
| 9,831,264 | B2 | 11/2017 | Choi et al. |
| 10,256,247 | B1 * | 4/2019 | Kanakamedala ............. H01L 21/28097 |
| 2015/0318301 | A1 * | 11/2015 | Lee ................... H01L 27/11582 257/324 |

(Continued)

FOREIGN PATENT DOCUMENTS

| | | |
|---|---|---|
| KR | 10-20110120536 A | 11/2011 |
| KR | 10-20140079915 A | 6/2014 |

(Continued)

*Primary Examiner* — Galina G Yushina
(74) *Attorney, Agent, or Firm* — Myers Bigel, P.A.

(57) ABSTRACT

A three-dimensional semiconductor device is disclosed. The device may include first and second stacks separated from each other in a first direction, with each of the stacks including electrodes vertically stacked on a substrate. The device may also include vertical channel structures that penetrate the electrodes and are connected to the substrate, an interlayered insulating layer on top surfaces of the vertical channel structures, and a support pattern located between opposite sidewalls of the first and second stacks, in the interlayered insulating layer. A bottom surface of the support pattern may be positioned at a higher level than a top surface of an uppermost electrode of the electrodes.

18 Claims, 46 Drawing Sheets

(56) References Cited

U.S. PATENT DOCUMENTS

2018/0026047 A1   1/2018  Park et al.
2018/0130814 A1*  5/2018  Lee .................. H01L 27/11568
2019/0172838 A1*  6/2019  Jo ............................ G11C 7/14
2019/0371812 A1*  12/2019  Oike .................. H01L 29/4234

FOREIGN PATENT DOCUMENTS

KR    10-20150116995 A    10/2015
KR    10-20180051183 A    5/2018

* cited by examiner

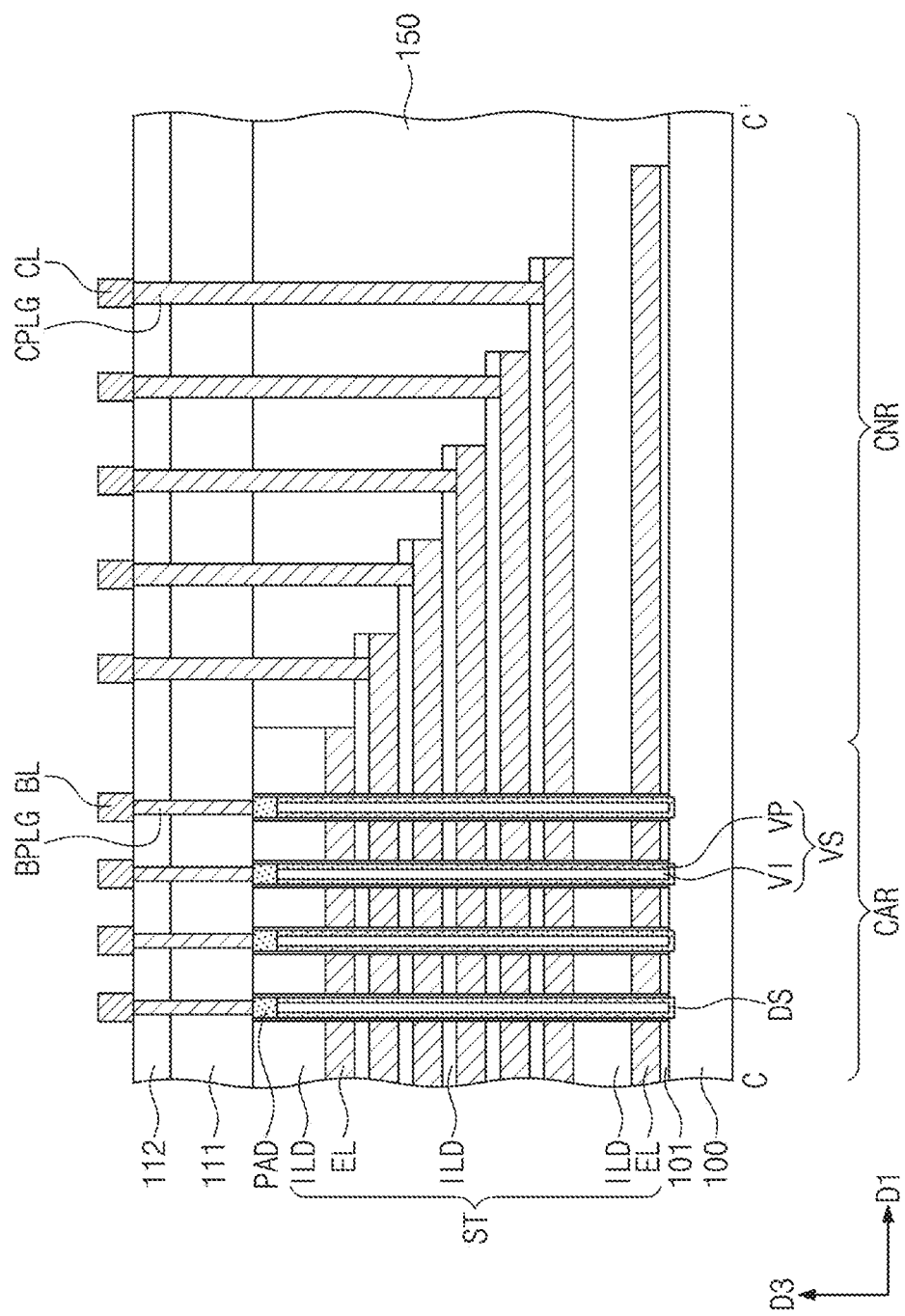

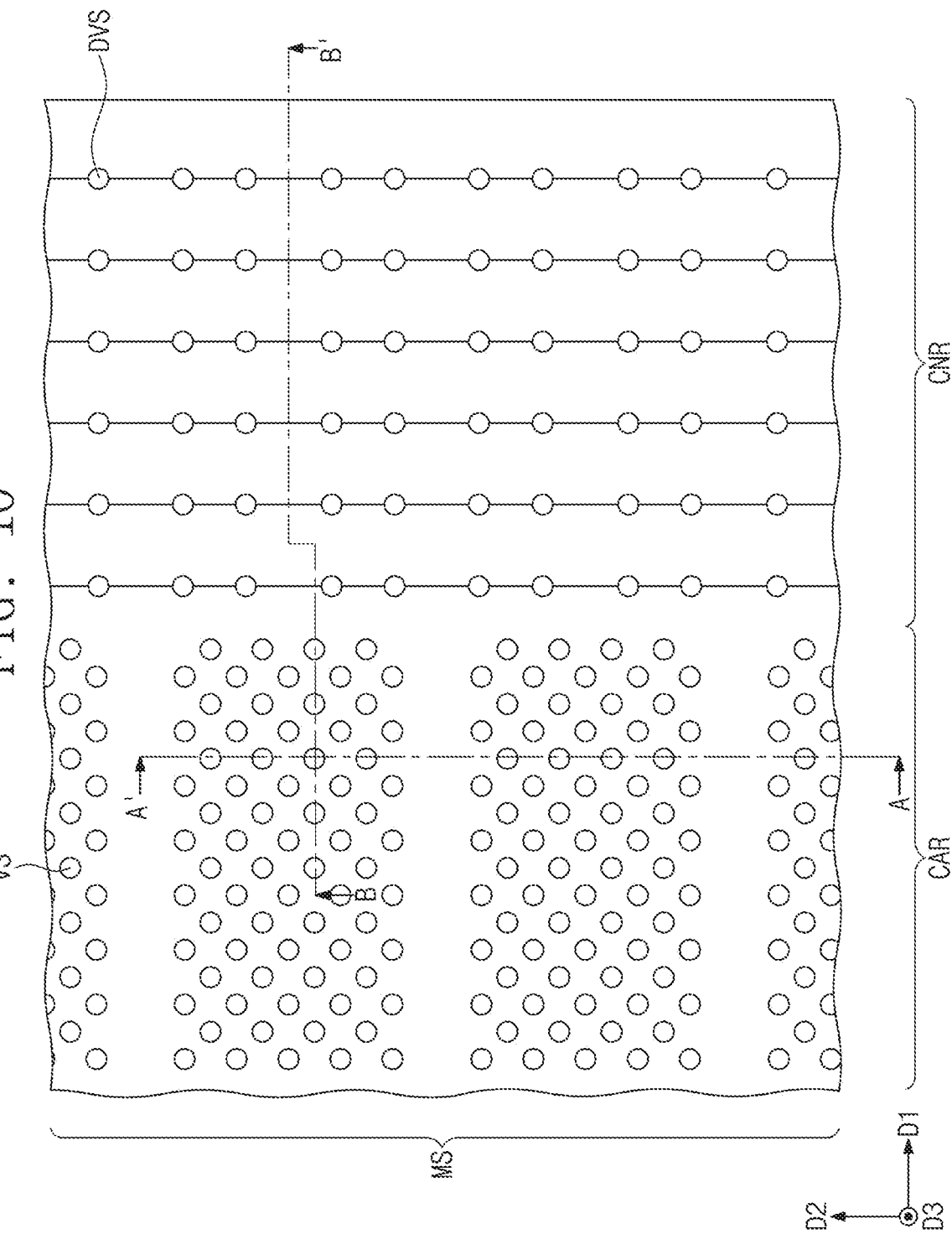

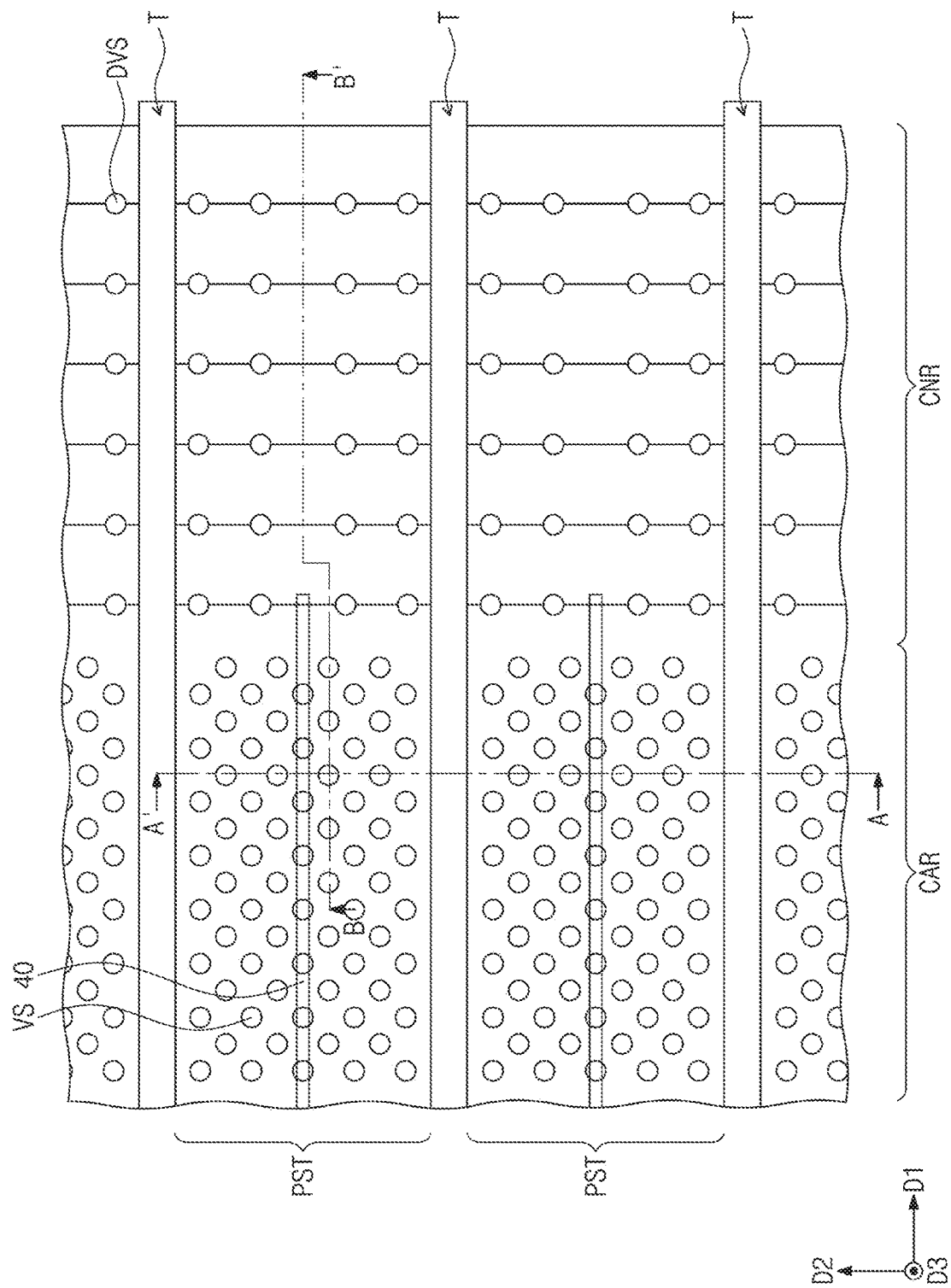

FIG. 23C
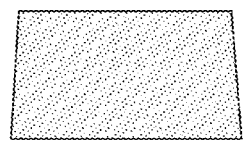 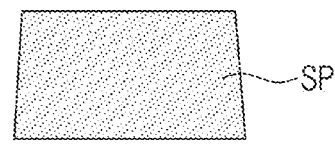
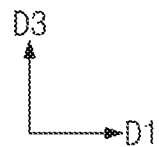

THREE-DIMENSIONAL SEMICONDUCTOR DEVICES

CROSS-REFERENCE TO RELATED APPLICATION

This U.S. non-provisional patent application claims priority under 35 U.S.C. § 119 to Korean Patent Application No. 10-2019-0085255, filed on Jul. 15, 2019, in the Korean Intellectual Property Office, the entire contents of which are hereby incorporated by reference.

TECHNICAL FIELD

The present disclosure relates to three-dimensional semiconductor devices, and in particular, to three-dimensional semiconductor devices having increased reliability and integration.

BACKGROUND

Increased integration of semiconductor devices is desirable to address consumer demands for increased performance and reduced prices. In semiconductor devices, since integration is an important factor in determining product prices, increased integration is especially desirable. In two-dimensional or planar semiconductor devices, integration is mainly determined by the area occupied by a unit memory cell. As such, integration of two-dimensional semiconductor devices is influenced by the level of a fine pattern forming technology. Increasing pattern fineness may require expensive processing equipment, which may in some instances be extremely expensive. This cost sets a practical limitation on increasing integration for two-dimensional or planar semiconductor devices. Three-dimensional semiconductor memory devices including three-dimensionally arranged memory cells have recently been proposed to overcome the high cost of increasing integration in two-dimensional or planar semiconductor devices.

SUMMARY

Aspects of the present disclosure provide three-dimensional semiconductor devices with improved reliability.

According to some embodiments of the inventive concepts, a three-dimensional semiconductor device may include first and second stacks separated from each other in a first direction, each of the first and second stacks including electrodes vertically stacked on a substrate. The semiconductor device may include: vertical channel structures that penetrate the electrodes and are connected to the substrate, an interlayered insulating layer on top surfaces of the vertical channel structures, and a support pattern located between opposite sidewalls of the first and second stacks in the interlayered insulating layer. A bottom surface of the support pattern may be positioned at a higher level than a top surface of an uppermost electrode of the electrodes.

According to some embodiments of the inventive concepts, a three-dimensional semiconductor device may include first and second stacks extended in a first direction and spaced apart from each other in a second direction crossing the first direction. Each of the first and second stacks includes electrodes vertically stacked on a substrate, and support patterns between opposite sidewalls of the first and second stacks and arranged in the first direction. Each of the support patterns includes a first pair of opposing sidewalls and a second pair of opposing sidewalls The three-dimensional semiconductor device includes an electrode separation structure between the pair of stacks and in contact with bottom surfaces of the support patterns and the first sidewalls of the support patterns. The second pair of opposing sidewalls of the support patterns may be aligned to sidewalls of the electrode separation structure, and widths of the support patterns in the first direction may increase with increasing distance from the substrate.

According to some embodiments of the inventive concepts, a three-dimensional semiconductor device may include a substrate including a cell array region and a connection region arranged in a first direction, first and second stacks, each including electrodes and insulating layers alternately stacked on the substrate, and each having a staircase structure on the connection region. The three-dimensional semiconductor device may include vertical channel structures on the cell array region that penetrate the stacks and are connected to the substrate, dummy vertical structures on the connection region that penetrate the stacks, an interlayered insulating layer in contact with the vertical channel structures and the dummy vertical structures, a bit line on the interlayered insulating layer and electrically connected to the vertical channel structures, cell contacts on the connection region that penetrate the interlayered insulating layer and are each coupled to a respective electrode, support patterns located between opposite sidewalls of the stacks in the interlayered insulating layer, and an electrode separation structure in a region between the stacks and covering bottom and side surfaces of the support patterns. The support patterns may have top surfaces located at a level lower than a bottom surface of the bit line, and bottom surfaces located at a level higher than a top surface of an uppermost electrode of the electrodes, and the support patterns may include a first support pattern between the vertical channel structures and a second support pattern between the cell contacts.

BRIEF DESCRIPTION OF THE DRAWINGS

To assist in understanding the inventive concepts disclosed herein, examples of embodiments are provided. These example embodiments will be more clearly understood from the following brief description taken in conjunction with the accompanying drawings. The accompanying drawings represent non-limiting, example embodiments as described herein.

FIGS. 3A, 3B, 3C, and 3D are sectional views taken along lines A-A', B-B', C-C', and D-D', respectively, of FIG. 2.

FIGS. 10, 12, 14, 16, 18, 20, 22, 24, and 26 are plan views illustrating a method of fabricating a three-dimensional semiconductor device, according to some embodiments of the inventive concepts.

FIGS. 21C, 23C, 25C, and 27C are sectional views taken along lines C-C' of FIGS. 20, 22, 24, and 26, respectively.

It should be noted that these figures are intended to illustrate the general characteristics of methods, structure and/or materials utilized in example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The example embodiments of the inventive concepts will now be described more fully with reference to the accompanying drawings, in which example embodiments are shown.

Figure 1:
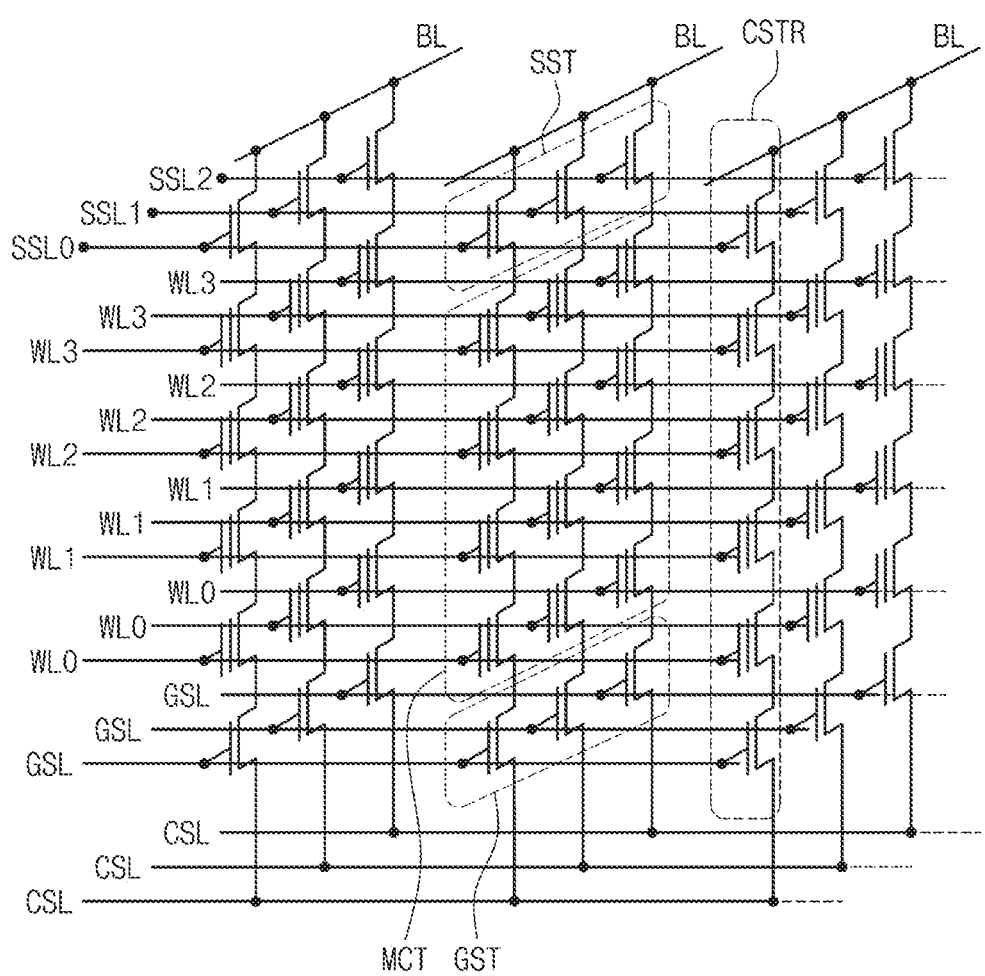
FIG. 1 is a circuit diagram schematically illustrating a cell array of a three-dimensional semiconductor device according to some embodiments of the inventive concepts.

FIG. 1 is a circuit diagram schematically illustrating a cell array of a three-dimensional semiconductor device according to some embodiments of the inventive concepts.

Referring to FIG. 1, a cell array of a three-dimensional semiconductor device according to some embodiments of the inventive concepts may include at least one common source line CSL, a plurality of bit lines BL, and a plurality of cell strings CSTR, which are disposed between the common source line CSL and the bit lines BL. In the example illustrated in FIG. 1, a plurality of common source lines CSL are provided, but the present disclosure is not limited thereto.

The bit lines BL may extend in parallel to each other, and a plurality of the cell strings CSTR may be connected in parallel to each of the bit lines BL. The cell strings CSTR may be connected in common to the at least one common source line CSL. In other words, a plurality of the cell strings CSTR may be provided between the plurality of bit lines BL and the at least one common source line CSL. In some embodiments, and as shown in FIG. 1, a plurality of common source lines CSL may extend in parallel to each other. In some embodiments, the common source lines CSL may be supplied with the same voltage, but in other embodiments, the common source lines CSL may be electrically separated from each other and may be independently controlled.

Each of the cell strings CSTR may include a ground selection transistor GST coupled to the common source line CSL, a string selection transistor SST coupled to the bit line BL, and a plurality of memory cell transistors MCT arranged between the ground and string selection transistors GST and SST. In some embodiments, the ground selection transistor GST, the string selection transistor SST, and the memory cell transistors MCT may be connected in series.

The common source line CSL may be connected in common to sources of the ground selection transistors GST. A ground selection line GSL may be used as a gate electrode of the ground selection transistor GST. A plurality of word lines WL0-WL3 may be used as gate electrodes for the memory cell transistors MCT. A plurality of string selection lines SSL may be used as a gate electrode of the string selection transistors SST. The ground selection line GSL, the plurality of word lines WL0-WL3, and the plurality of string selection lines SSL may be arranged between the at least one common source line CSL and the bit lines BL. Each of the memory cell transistors MCT may include a data storage element.

Figure 2:
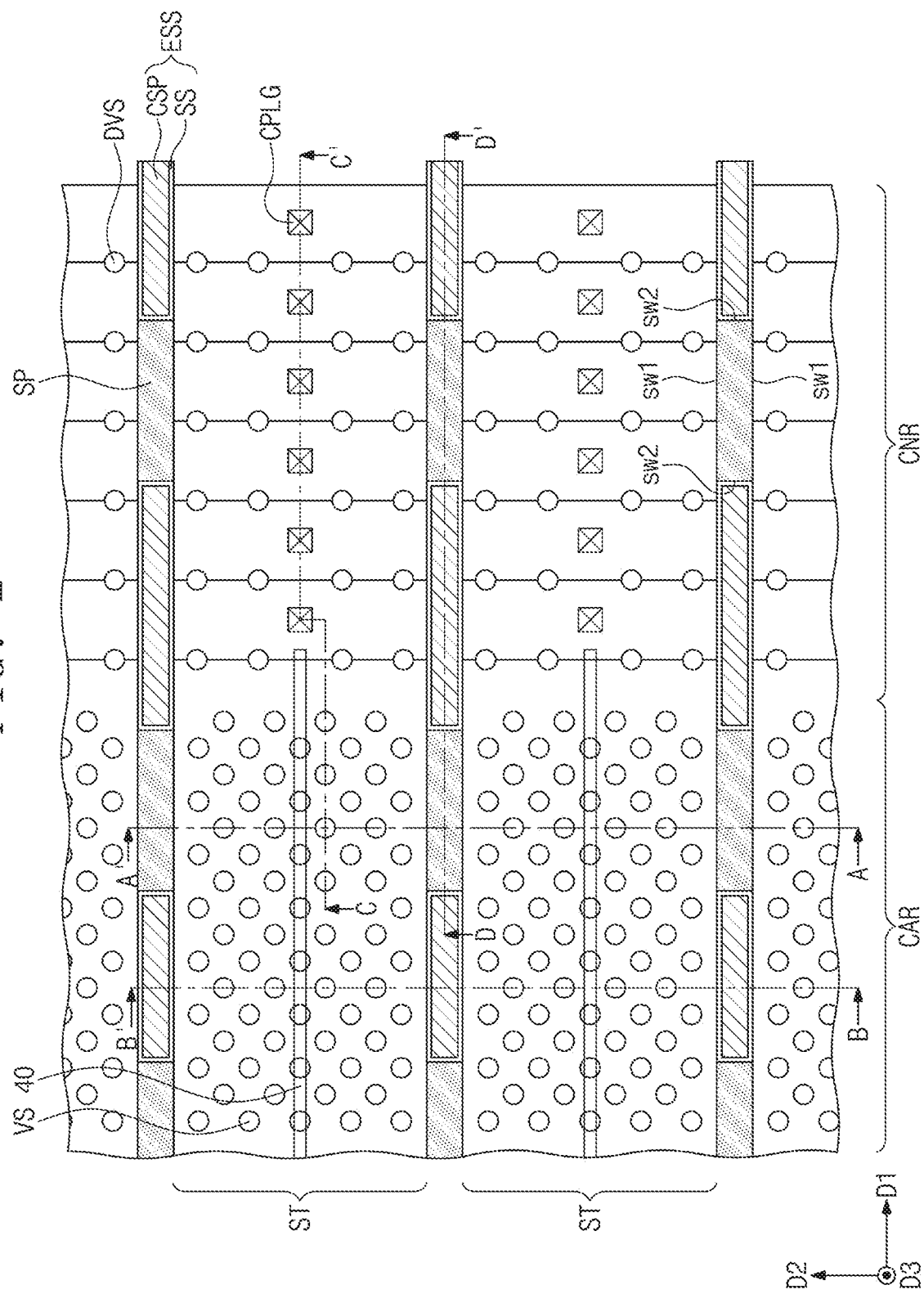
FIG. 2 is a plan view illustrating a three-dimensional semiconductor device according to some embodiments of the inventive concepts.

FIG. 2 is a plan view illustrating a three-dimensional semiconductor device according to some embodiments of the inventive concepts. FIGS. 3A, 3B, 3C, and 3D are sectional views taken along lines A-A', B-B', C-C', and D-D', respectively, of FIG. 2. FIGS. 4A and 4B are enlarged views illustrating a portion 'AA' of FIG. 3A.

Referring to FIGS. 2, 3A, 3B, and 3D, a substrate 100 may include a cell array region CAR and a connection region CNR. The cell array region CAR and the connection region CNR may be adjacent to each other in a first direction D1. The substrate 100 may be a silicon substrate, a silicon-germanium substrate, a germanium substrate, or a single-crystalline epitaxial layer grown on a single-crystalline silicon substrate. The substrate 100 may be doped to have a first conductivity type. The first conductivity type may be, for example, a p-type.

Stacks ST may be on the cell array region CAR and the connection region CNR. The stacks ST may extend in the first direction D1 parallel to each other. The stacks ST may be spaced apart from each other in a second direction D2 that is perpendicular to the first direction D1. The first direction D1 and the second direction D2 may be horizontal directions, each being substantially parallel to a top surface of the substrate 100. A buffer insulating layer 101 may be interposed between the stacks ST and the substrate 100. The buffer insulating layer 101 may include a silicon oxide layer.

Each of the stacks ST may include electrodes EL and insulating layers ILD, which are repeatedly and alternately stacked in a third direction D3 that is perpendicular to a top surface of the substrate 100. The electrodes EL may have substantially the same thickness, and the insulating layers ILD may have at least two different thicknesses, depending on desired characteristics of the semiconductor memory device. In some embodiments, the thickness of each insulating layer ILD may be less than the thickness of each electrode EL. In some embodiments, at least one of the insulating layers ILD may be thicker than the electrode EL. The electrodes EL may be formed of or include at least one of, for example, doped semiconductors (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The insulating layers ILD may include, for example, a silicon oxide layer or a low-k dielectric layer.

As best seen in FIG. 3C, stacks ST may have a stepwise structure, on the connection region CNR. For example, on the connection region CNR, lengths of the electrodes EL in the first direction D1 may decrease with increasing distance from the substrate 100, and a height of the stack ST may decrease with increasing distance from the cell array region CAR. In addition, on the connection region CNR, the electrodes EL may have sidewalls that are spaced apart from each other in the first direction D1 by a specific distance. The sidewalls of the electrodes EL may be substantially perpendicular to the top surface of the substrate 100. Each of the electrodes EL may have a pad portion on the connection region CNR, and the pad portions of the electrodes EL may be located at positions that are horizontally and vertically different from each other. The stack ST is illustrated to have the stepwise structure in the first direction D1, but in some embodiments, the stack ST may also be provided to have a stepwise structure in the second direction D2.

In some embodiments, the three-dimensional semiconductor device may be a vertical-type NAND FLASH memory device, and the electrodes EL may serve as gate electrodes for controlling the memory cell transistors MCT (e.g., see FIG. 1). For example, the electrodes EL may be used as the ground selection lines GSL, the word lines WL0-WL3, and the string selection lines SSL described with reference to FIG. 1.

The uppermost ones of the electrodes EL may be spaced apart from each other, in the second direction D2, by an insulating separation pattern 40. The uppermost ones of the electrodes EL may be used as the string selection lines SSL described with reference to FIG. 1. An uppermost insulating layer ILD, which is on top surfaces of the uppermost electrodes EL, may be thicker than the insulating layers ILD interposed between the electrodes EL.

As shown in FIG. 4A, a horizontal insulating pattern HP may extend from a region between the electrodes EL and vertical channel structures VS (described more fully herein) into other regions, which are positioned on top and bottom surfaces of the electrodes EL. The horizontal insulating pattern HP may include a charge storing layer and a blocking insulating layer, which are used as a portion of the data storing layer of the NAND FLASH memory device. In some embodiments, the horizontal insulating pattern HP may include the blocking insulating layer, but may omit the charge storing layer.

Referring back to FIGS. 2, 3A, 3B, 3C, and 3D, an insulating planarization layer 150 may be provided on the substrate 100 to cover the stack ST. The insulating planarization layer 150 may have a substantially flat top surface and may cover the stepwise structure of the stack ST on the connection region CNR. The top surface of the insulating planarization layer 150 may be coplanar with the top surface of the uppermost one of the insulating layers ILD in the stack ST on the cell array region CAR. The insulating planarization layer 150 may be or include a single insulating layer or a plurality of stacked insulating layers. For example, the insulating planarization layer 150 may include a silicon oxide layer and/or a low-k dielectric layer.

Vertical channel structures VS may be provided on the cell array region CAR to penetrate the stack ST. The vertical channel structure VS may penetrate the electrodes EL and may be electrically connected to the substrate 100. When viewed in a plan view, the vertical channel structures VS may be arranged to form a zigzag shape or a diagonal shape in the first direction D1. The vertical channel structures VS may be formed of or include a semiconductor material or a conductive material. The vertical channel structures VS may have bottom surfaces, which are located between top and bottom surfaces of the substrate 100. In some embodiments, the vertical channel structures VS may extend into the substrate 100 from a top surface of the substrate 100.

In some embodiments, each of the vertical channel structures VS may include a semiconductor pattern VP, which penetrates the stacks ST and is in contact with the substrate 100, and an insulating filling pattern VI, which fills an internal space of the semiconductor pattern VP. An upper portion of the semiconductor pattern VP may have a hollow pipe shape or a hollow macaroni shape. The semiconductor pattern VP may also have a bottom portion, which may be closed and which may be connected to the substrate 100. The semiconductor pattern VP may be in an undoped or intrinsic state or may be doped to have the same conductivity type as the substrate 100. The semiconductor pattern VP may have a poly- or single-crystalline structure. The insulating filling pattern VI may be formed of or include silicon oxide or silicon oxynitride. In some embodiments, the insulating filling pattern VI may be omitted.

A memory layer DS may be provided between the semiconductor pattern VP and the electrodes EL. In some embodiments, the memory layer DS may be provided between the semiconductor pattern VP and the horizontal insulating pattern HP. The memory layer DS may include a tunnel insulating layer, a charge storing layer, and a blocking insulating layer, which are sequentially stacked on the semiconductor pattern VP. The blocking insulating layer may be a multilayer including a plurality of thin films. For example, the blocking insulating layer may include at least one of hafnium oxide layer, an aluminum oxide layer and/or a silicon oxide layer. If more than one is present, the stacking order of the hafnium oxide layer, the aluminum oxide layer, and the silicon oxide layer may be variously changed. The charge storing layer may be a charge trap layer or an insulating layer containing conductive nano particles. The charge trap layer may be, for example, a silicon nitride layer. The tunnel insulating layer may include a silicon oxide layer. The tunnel insulating layer may further include a high-k dielectric layer (e.g., a hafnium oxide layer or an aluminum oxide layer). In some embodiments, the memory layer DS may be a variable resistance pattern. The variable resistance pattern may include at least one variable resistance material, having a resistance that can be changed.

Conductive patterns PAD may be provided on or in upper portions of the vertical channel structures VS. The conductive patterns PAD may be formed of or include at least one of doped semiconductor or metallic materials. For example, the conductive patterns PAD may include the same material as the semiconductor pattern VP. In some embodiments, the conductive patterns PAD may be formed of or include a doped poly silicon. In some embodiments, the memory layer DS may be provided on a sidewall of the conductive pattern PAD.

A first interlayered insulating layer 111 may be provided to cover the stack ST. In addition, the first interlayered insulating layer 111 may cover the insulating planarization layer 150. The first interlayered insulating layer 111 may include a silicon oxide layer.

Support patterns SP and an electrode separation structure ESS may be disposed between an adjacent pair of the stacks ST. The support patterns SP may be arranged in the first direction D1. The support patterns SP may be disposed between opposite sidewalls of the pair of the stacks ST. The support patterns SP may be spaced apart from the top surface of the substrate 100 to support an upper portion of the stacks ST. In detail, the support patterns SP may be extended from a region, which is provided between the opposite sidewalls of the pair of the stacks ST, into first interlayered insulating layers 111. The support patterns SP may be spaced apart from each other in the first direction D1 to partially expose the sidewalls of the stacks ST. The electrode separation structure ESS may be extended in the first direction D1 to fill a space between the stacks ST.

Figure 3A:
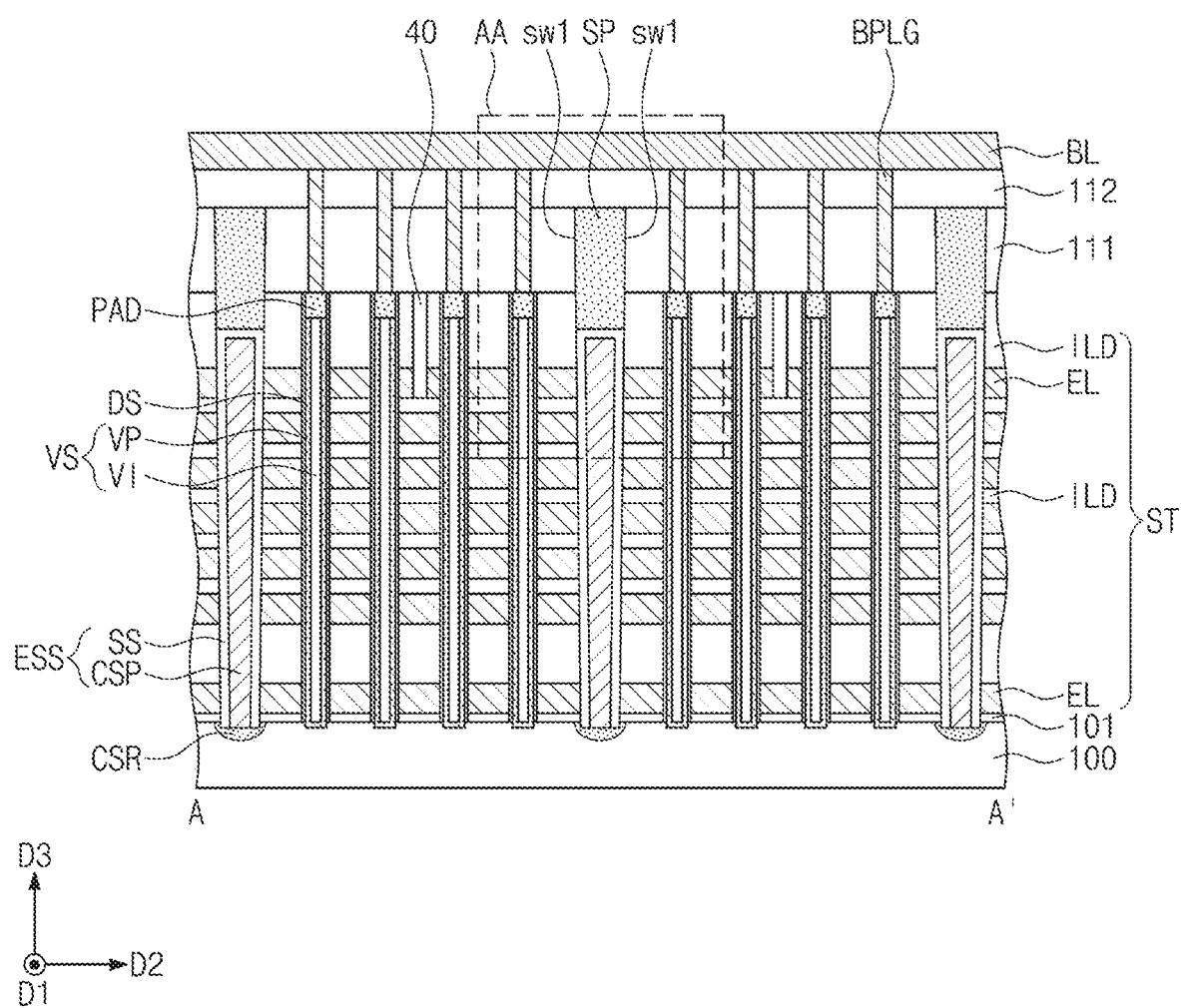
Figure 3B:
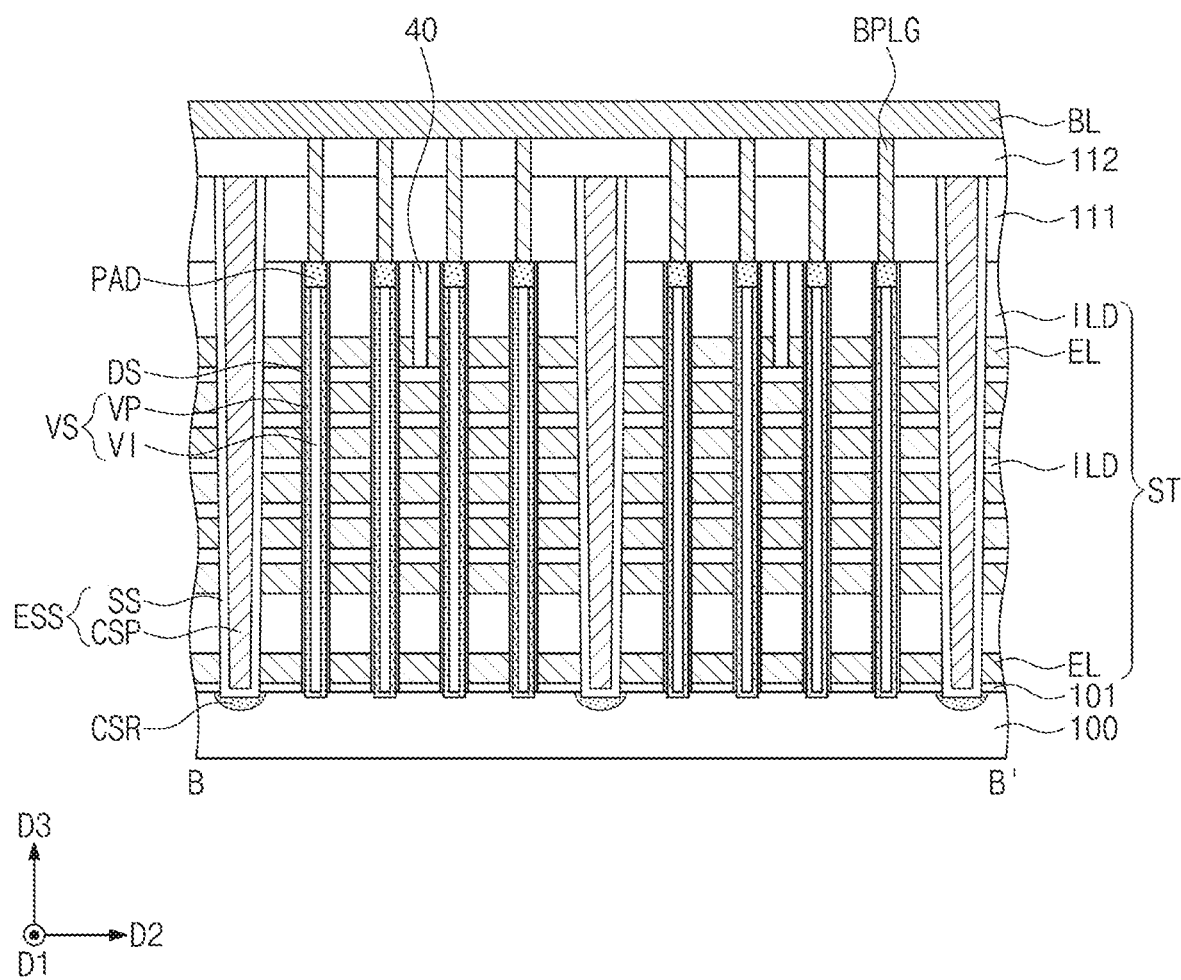
Figure 3D:
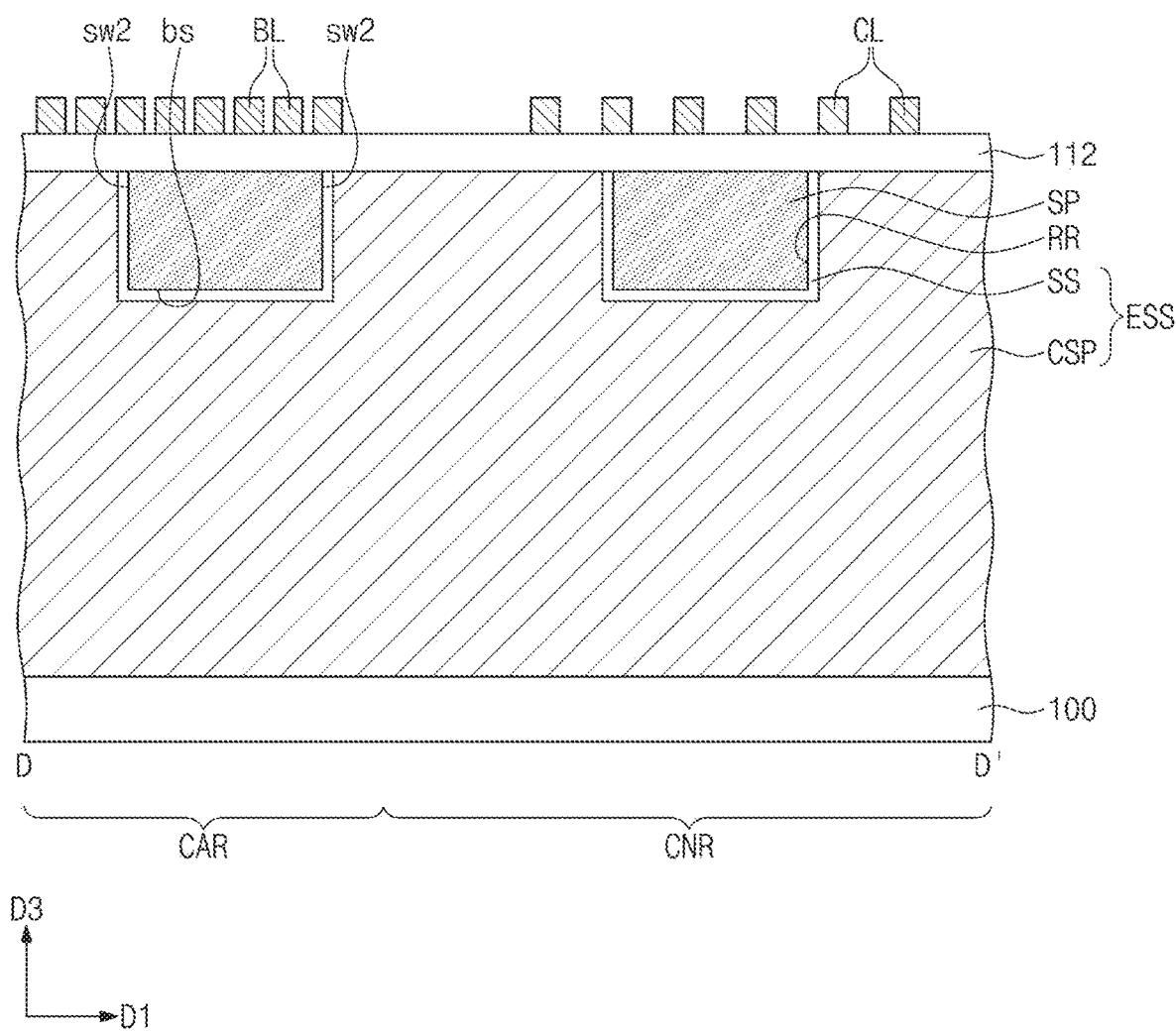
Figure 4A:
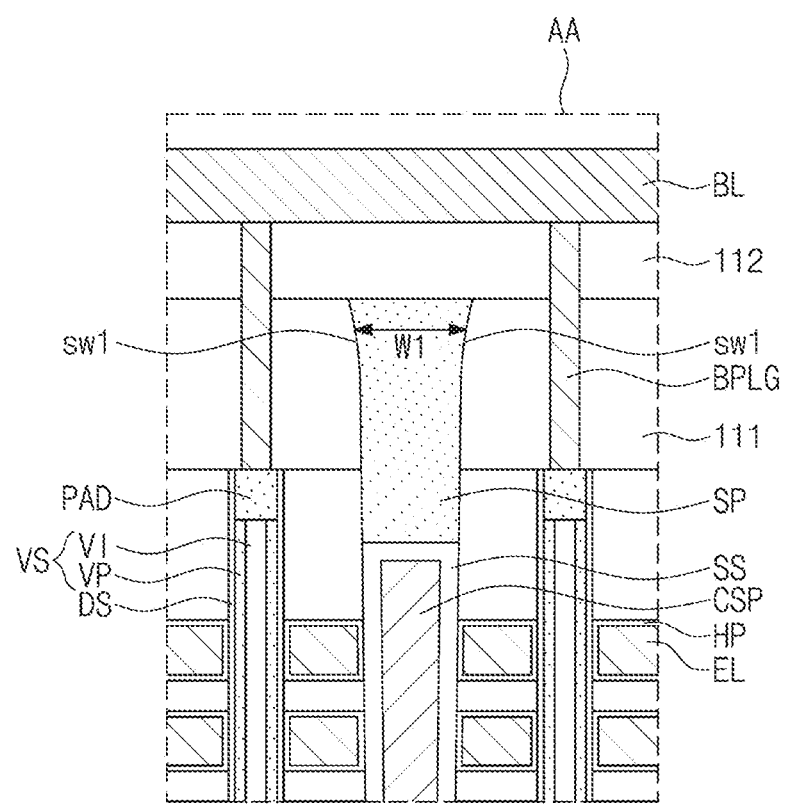
FIGS. 4A and 4B are enlarged views illustrating a portion 'AA' of FIG. 3A.
Figure 4B:
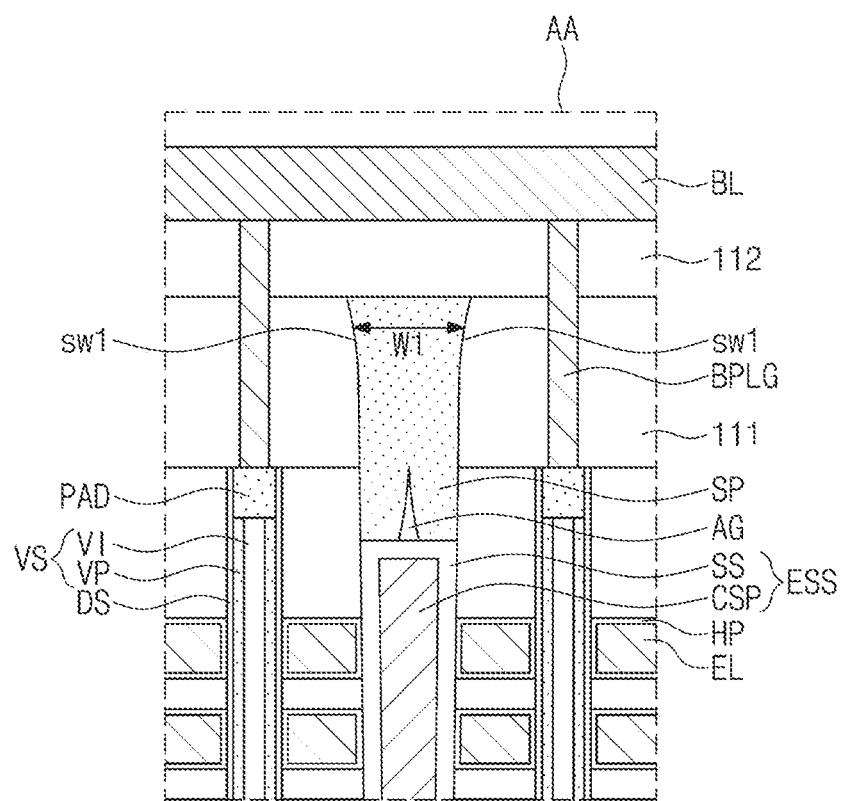

In more detail, and as seen in FIGS. 3A, 3D, and 4A, the support pattern SP may have second sidewalls sw2, which are opposite to each other in the first direction D1, and first sidewalls sw1, which are opposite to each other in the second direction D2. A width of each of the support patterns SP in the second direction D2 may be less than a width of each of the support patterns SP in the first direction D1. That is, in each of the support patterns SP, a distance between the second sidewalls sw2 may be greater than a distance between the first sidewalls sw1. The first sidewalls sw1 of the support patterns SP may face the sidewalls of the stacks ST. The second sidewall sw2 of the support pattern SP may face the second sidewall sw2 of another support pattern SP adjacent thereto. As shown in FIG. 4A, the support pattern SP may have a width W1, which increases with increasing distance from the substrate 100, when measured in the second direction D2. The width of the support pattern SP in the second direction D2 may be largest at its top level. The width of the support pattern SP in the first direction D1 may be uniform, as shown in FIG. 3D.

The electrode separation structure ESS may cover a bottom surface bs and the second sidewalls sw2 of the support patterns SP. The electrode separation structure ESS may not cover the first sidewalls sw1 of the support patterns SP. The first sidewalls sw1 of the support patterns SP may be free of the electrode separation structure ESS. The support pattern SP may be inserted in the electrode separation structure ESS, and as such, a top surface of the electrode separation structure ESS may have a recess region RR. A bottom surface of the recess region RR may be located at a level lower than the top surfaces of the stacks ST. A width of the electrode separation structure ESS in the second direction D2 may increase with increasing distance from the substrate 100. The width of the electrode separation structure ESS in the second direction D2 may be largest at its top level. A top surface of the electrode separation structure ESS may be coplanar with a top surface of the support pattern SP. A distance between adjacent ones of the stacks ST may be uniform in the second direction D2. Thus, at the same vertical level, the width of the electrode separation structure ESS in the second direction D2 may be equal to the width of the support pattern SP in the second direction D2. That is, the largest width of the support pattern SP in the second direction D2 may be substantially equal to the largest width of the electrode separation structure ESS in the second direction D2. Some of sidewalls of the electrode separation structure ESS may be aligned to the first sidewalls sw1 of the support pattern SP.

In some embodiments, the electrode separation structure ESS may include a common source plug CSP and an insulating spacer SS. The common source plug CSP may be coupled to a common source region CSR, which may be formed in a region of the substrate 100 between the stacks ST. In some embodiments, the common source region CSR may be an impurity region, which is formed near the top surface of the substrate 100 exposed between adjacent ones of the stacks ST. The common source region CSR may be doped to have a different conductivity type from the substrate 100. The common source plug CSP may be a plate-shaped structure that is extended along the common source region CSR. In some embodiments, the common source plugs CSP may have a pillar shape. casein such embodiments, an additional line may be provided to connect the pillar-shaped common source plugs CSP, which are arranged in the first direction D1, to each other.

The insulating spacer SS may be interposed between the common source plug CSP and the sidewalls of the stacks ST. The insulating spacer SS may be formed of or include at least one of, for example, silicon oxide, silicon nitride, silicon oxynitride, or low-k materials having low dielectric constants. The insulating spacer SS may electrically disconnect the common source plug CSP from the electrodes EL. The insulating spacer SS may also be interposed between the support pattern SP and the common source plug CSP. The insulating spacer SS may be provided between the bottom surface bs of the support pattern SP and a bottom surface of the recess region RR of the common source plug CSP. In addition, the insulating spacer SS may be provided between the second sidewall sw2 of the support patterns SP and an inner sidewall of the recess region RR of the common source plug CSP.

The second interlayered insulating layer 112 may be provided on the first interlayered insulating layer 111. The second interlayered insulating layer 112 may cover the top surface of the support pattern SP and the top surface of the electrode separation structure ESS.

The bit lines BL may be disposed on the second interlayered insulating layer 112 of the cell array region CAR and may be electrically connected to the vertical channel structures VS1 through bit line contact plugs BPLG. Connection lines CL may be disposed on the second interlayered insulating layer 112 of the connection region CNR and may be coupled to cell contacts CPLG.

Referring to FIG. 4B, in some embodiments, the support pattern SP may include a recessed portion, which is recessed from its bottom surface toward its top surface. In other words, the support pattern is provided to define a recessed portion, which is recessed from its bottom surface toward its top surface. An air gap AG may be defined in the recessed portion of the support pattern SP.

Figure 5:
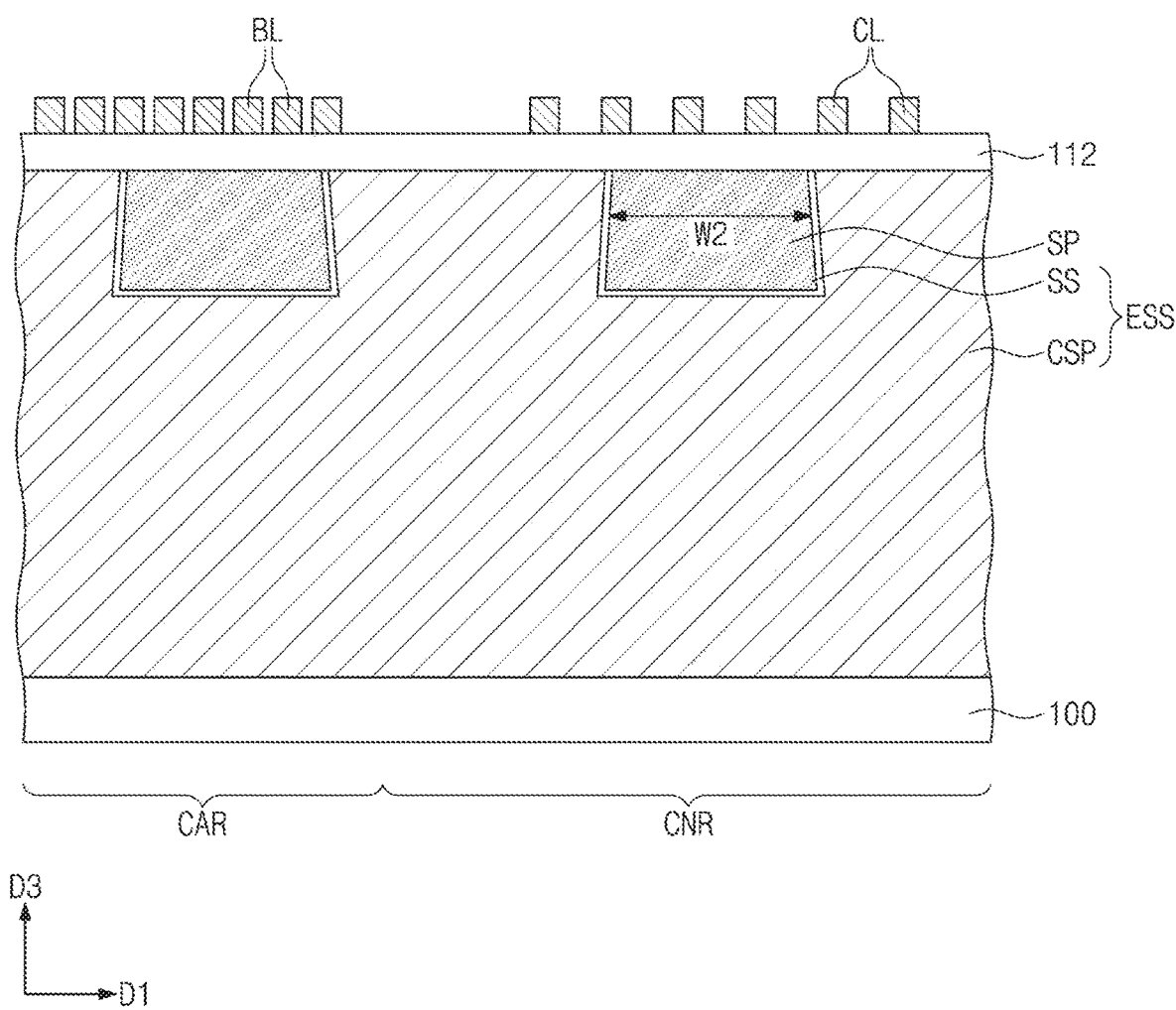
FIG. 5 is a sectional view, which is taken along the line D-D' of FIG. 2 to illustrate a three-dimensional semiconductor device according to some embodiments of the inventive concepts.

FIG. 5 is a sectional view, which is taken along the line D-D' of FIG. 2 to illustrate a three-dimensional semiconductor device according to some embodiments of the inventive concepts.

Referring to FIG. 5, a width W2 of the support pattern SP in the first direction D1 may increase with decreasing distance from the substrate 100. For example, a distance between sidewalls of two adjacent support patterns SP may increase with increasing distance from the substrate 100.

Figure 6:
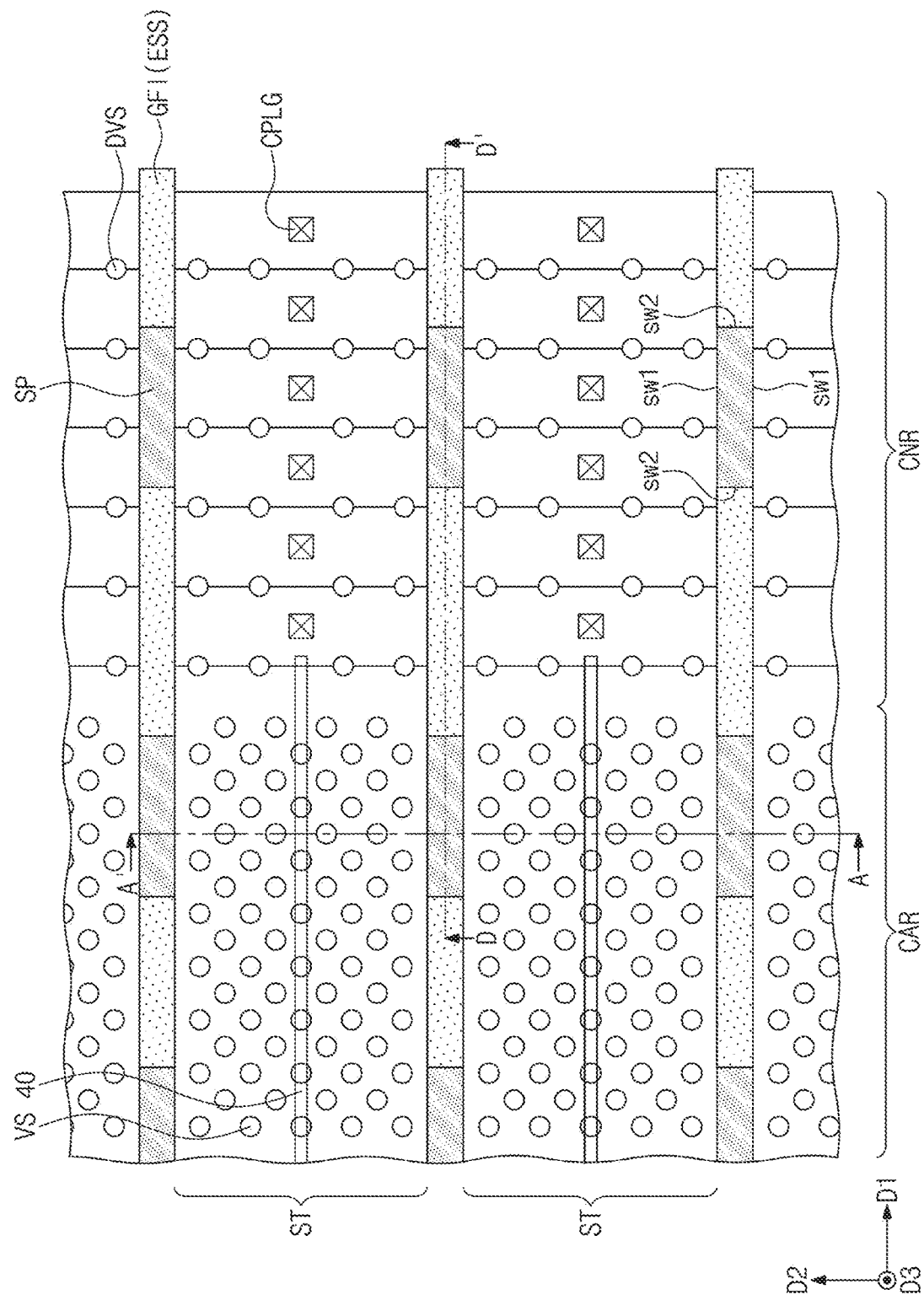
FIG. 6 is a plan view illustrating a three-dimensional semiconductor device according to some embodiments of the inventive concepts.
Figure 7A:
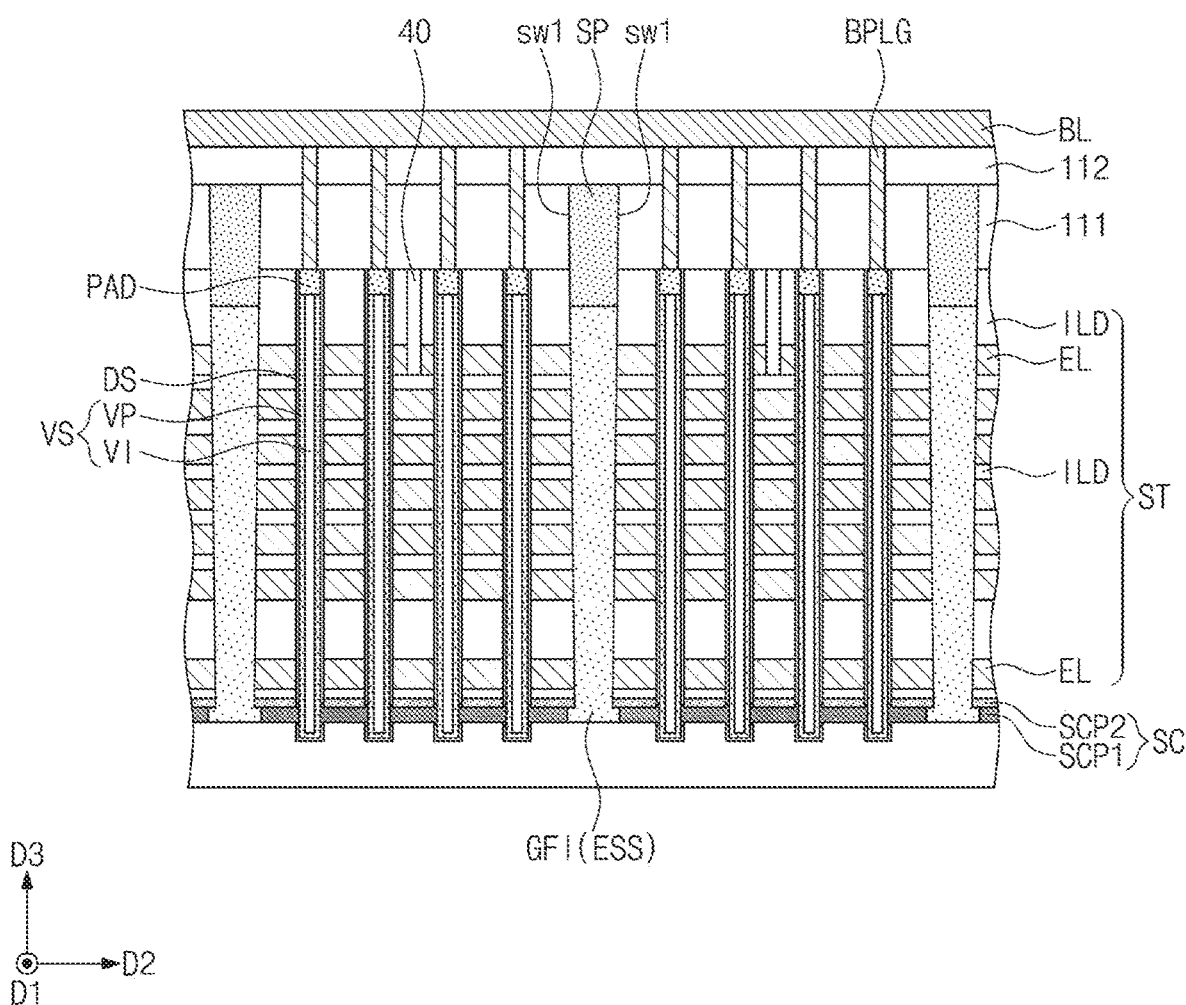
FIGS. 7A and 7B are sectional views taken along lines A-A' and B-B', respectively, of FIG. 6.
Figure 7B:
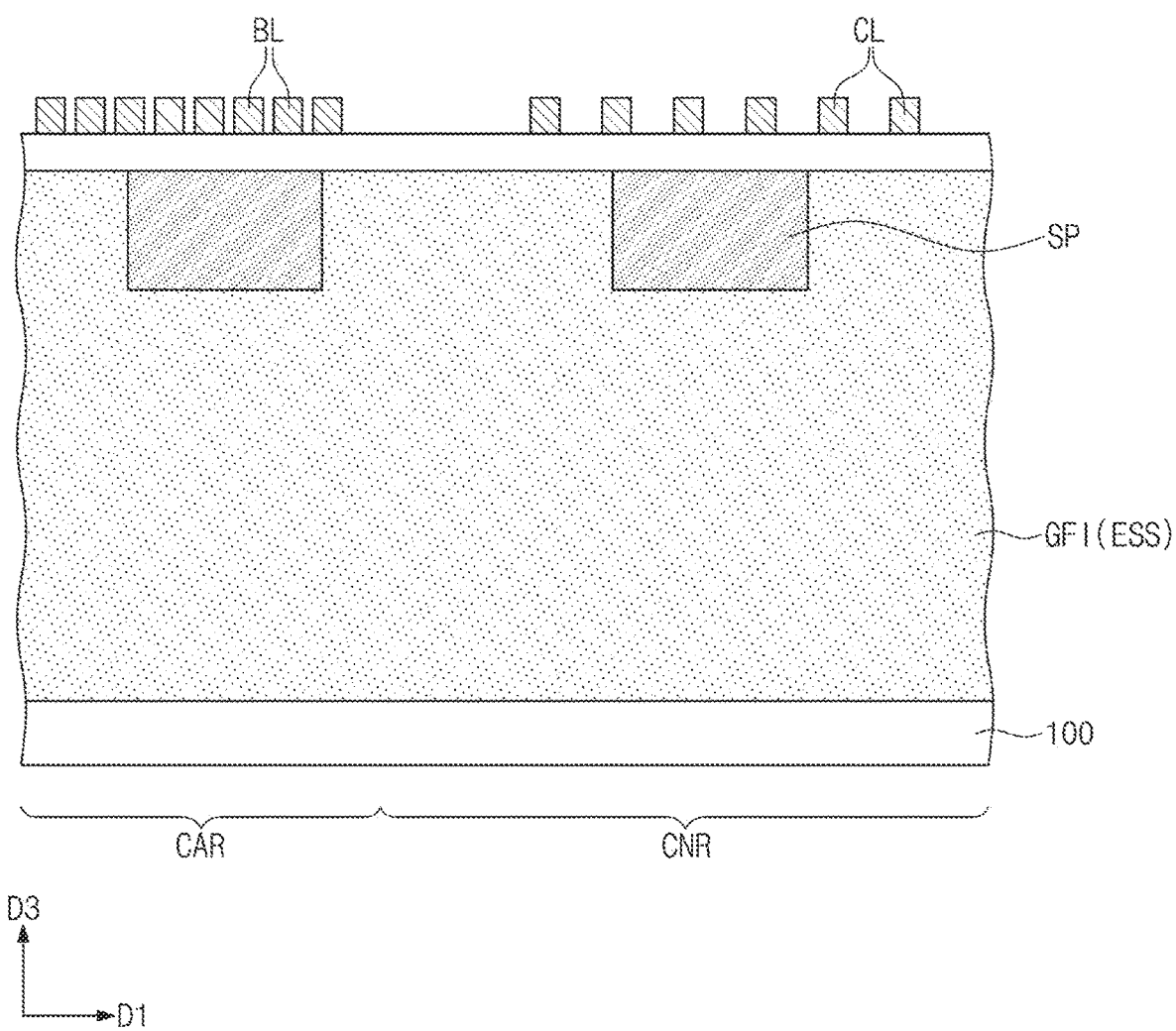

FIG. 6 is a plan view illustrating a three-dimensional semiconductor device according to some embodiments of the inventive concepts. FIGS. 7A and 7B are sectional views taken along lines A-A' and B-B', respectively, of FIG. 6. For concise description, elements previously described with reference to FIGS. 2 and 3A to 3D may be identified by the same reference label or number without repeating an overlapping description thereof.

Referring to FIGS. 6, 7A and 7B, the electrode separation structure ESS according to some embodiments of the inventive concepts may include an insulating filling pattern GFI, which may fill a space between a pair of the stacks ST. The insulating filling pattern GFI may include at least one of silicone-based materials (e.g., spin-on-hardmask (SOH) materials) or carbon-based materials (e.g., amorphous carbon layer (ACL)). The insulating filling pattern GFI may extend in the first direction D1 and may completely fill a space between the stacks ST. That is, the common source plug CSP may not be formed between the opposite sidewalls of the stacks ST and may be omitted.

In some embodiments, a source structure SC may be disposed on the top surface of the substrate 100. The source structure SC may include first and second source conductive patterns SCP1 and SCP2, which are sequentially stacked. The first and second source conductive patterns SCP1 and SCP2 may be connected to sidewalls of the vertical channel structures VS. The first and second source conductive patterns SCP1 and SCP2 may be formed of or include a doped semiconductor material. The first and second source conductive patterns SCP1 and SCP2 may be doped to have a different conductivity type from the substrate 100.

Figure 8:
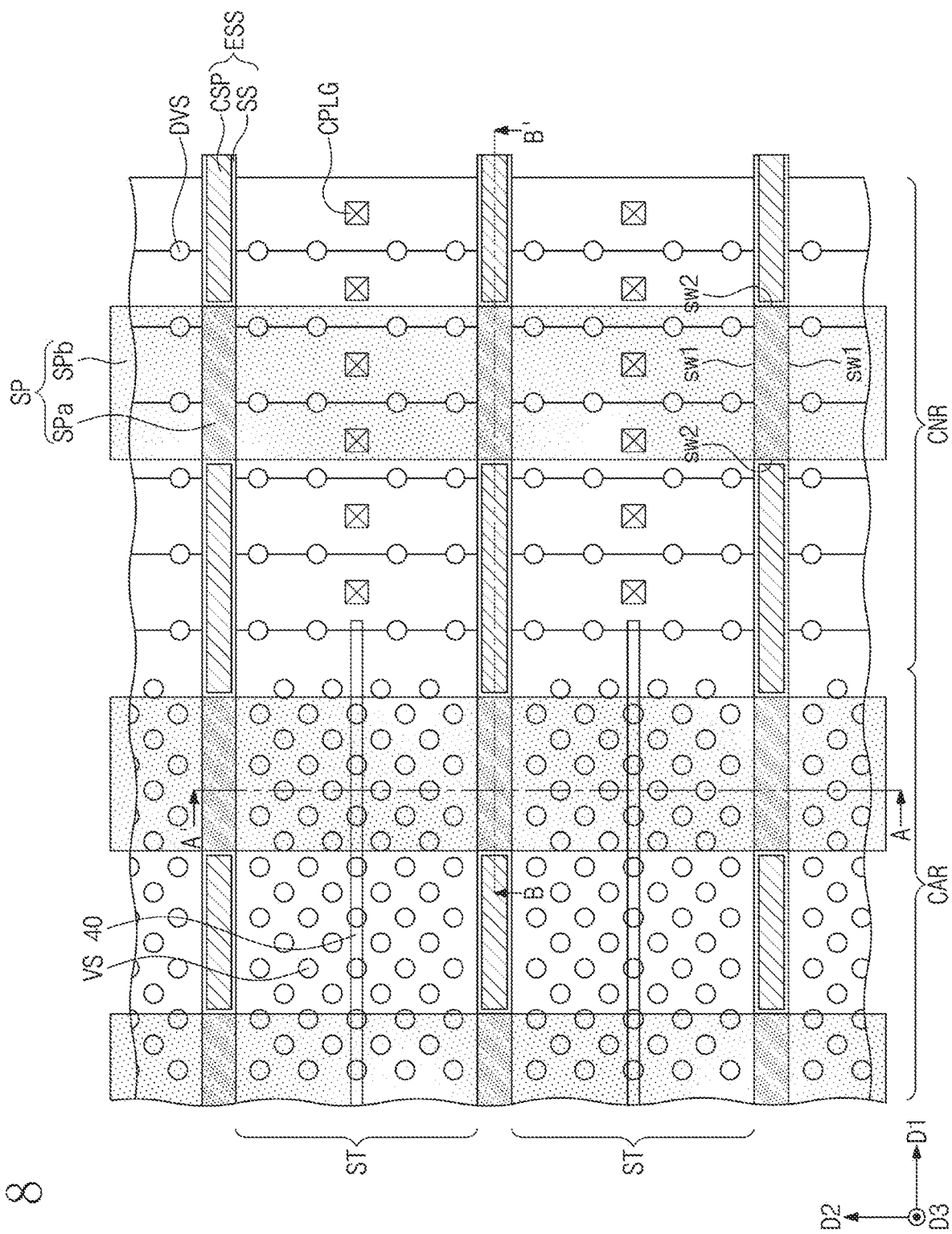
FIG. 8 is a plan view illustrating a three-dimensional semiconductor device according to some embodiments of the inventive concepts.
Figure 9A:
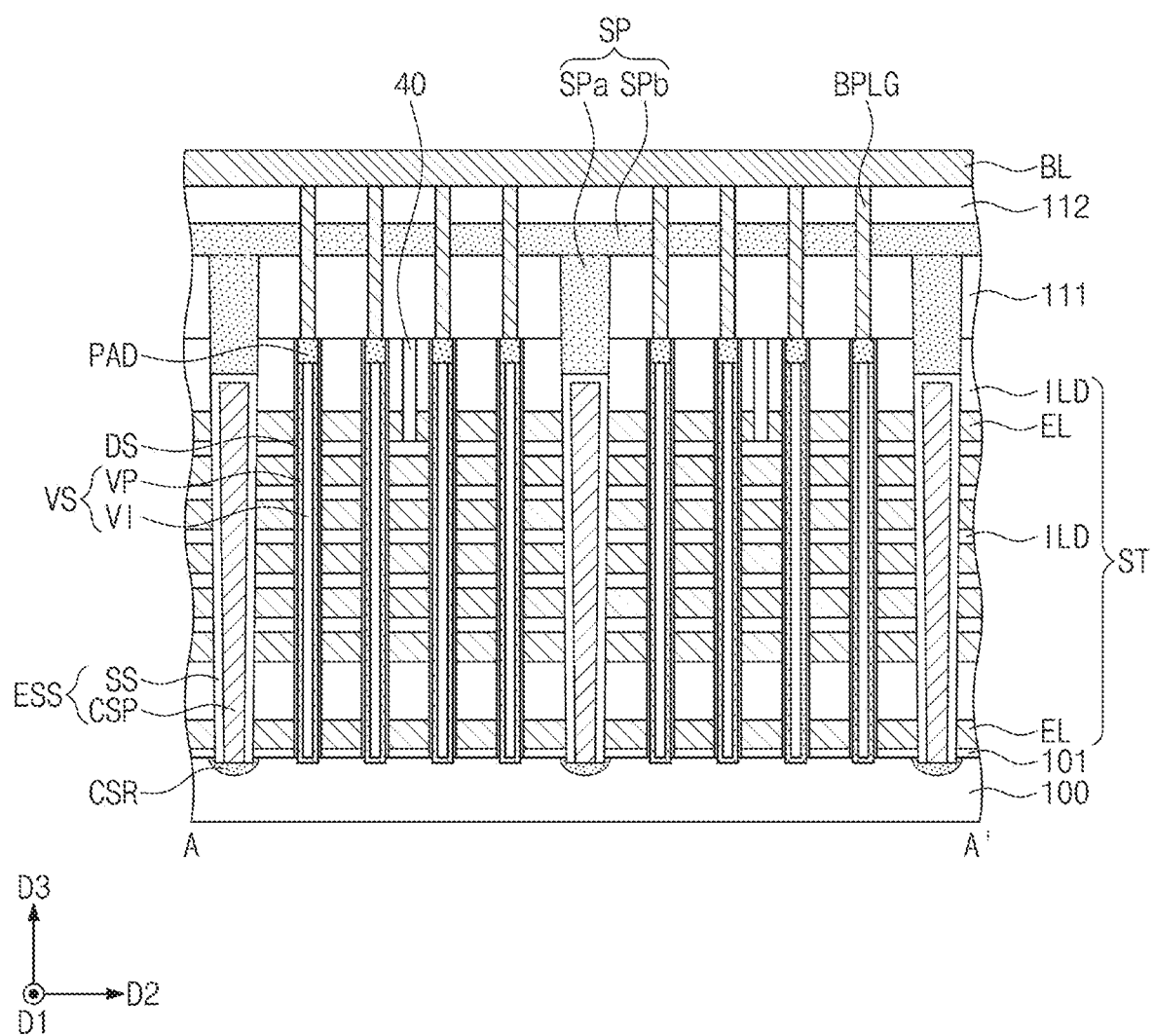
FIGS. 9A and 9B are sectional views taken along lines A-A' and B-B', respectively, of FIG. 8.
Figure 9B:
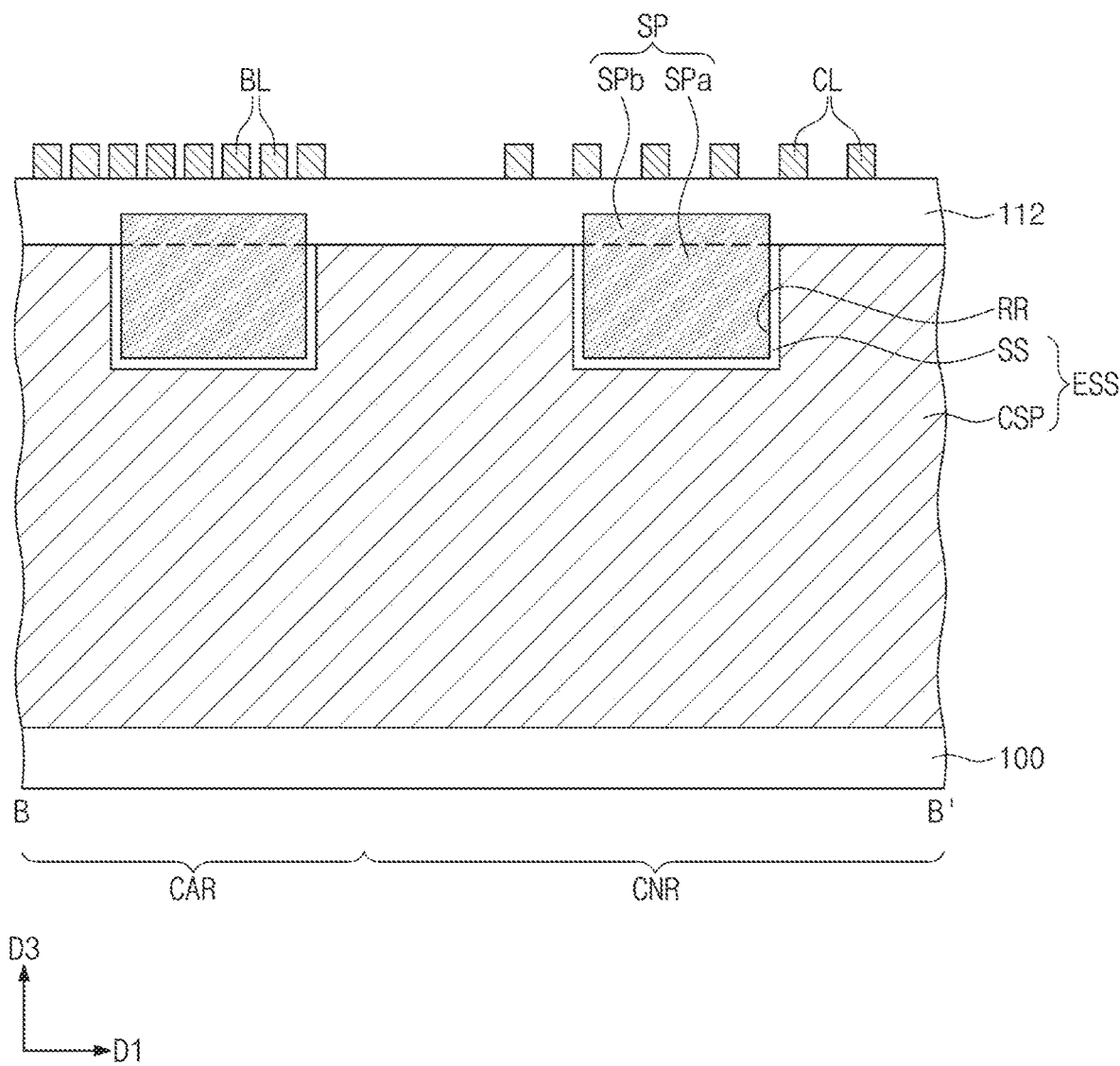

FIG. 8 is a plan view illustrating a three-dimensional semiconductor device according to some embodiments of the inventive concepts. FIGS. 9A and 9B are sectional views taken along lines A-A' and B-B', respectively, of FIG. 8. For concise description, elements previously described with reference to FIGS. 2 and 3A to 3D may be identified by the same reference label or number without repeating an overlapping description thereof.

Referring to FIGS. 8, 9A, and 9B, the support pattern SP may include a first portion SPa and a second portion SPb on the first portion SPa. The first portion SPa may be between a pair of the stacks ST and may be extended in the third direction D3. In detail, the first portion SPa may be extended from a region, which is provided between opposite sidewalls of the pair of the stacks ST, into the first and second interlayered insulating layers 111 and 112. A bottom surface of the first portion SPa may be positioned at a level higher than a top surface of the uppermost one of the electrodes EL.

The second portion SPb may be horizontally extended in the second direction D2, in the first and second interlayered insulating layers 111 and 112. The second portion SPb may connect the first portions SPa, which are spaced apart from each other in the second direction D2 with the stack ST interposed therebetween. The bit line contact plugs BPLG may be provided to penetrate the second portions SPb and may be coupled to the conductive patterns PAD. A top surface of the second portion SPb may be positioned at a level that is lower than a top surface of the second interlayered insulating layer 112 and is higher than a bottom surface of the second interlayered insulating layer 112. In some embodiments, a plurality of the second portions SPb may be arranged in the first direction D1.

FIGS. 10, 12, 14, 16, 18, 20, 22, 24, and 26 are plan views illustrating a method of fabricating a three-dimensional semiconductor device, according to some embodiments of the inventive concept. FIGS. 11A, 13A, 15A, 17A, 19A, 21A, 23A, 25A, and 27A are sectional views taken along lines A-A' of FIGS. 10, 12, 14, 16, 18, 20, 22, 24, and 26, respectively. FIGS. 11B, 13B, 15B, 17B, 19B, 21B, 23B, 25B, and 27B are sectional views taken along lines B-B' of FIGS. 10, 12, 14, 16, 18, 20, 22, 24, and 26, respectively. FIGS. 21C, 23C, 25C, and 27C are sectional views taken along lines C-C' of FIGS. 20, 22, 24, and 26, respectively.

Figure 11A:
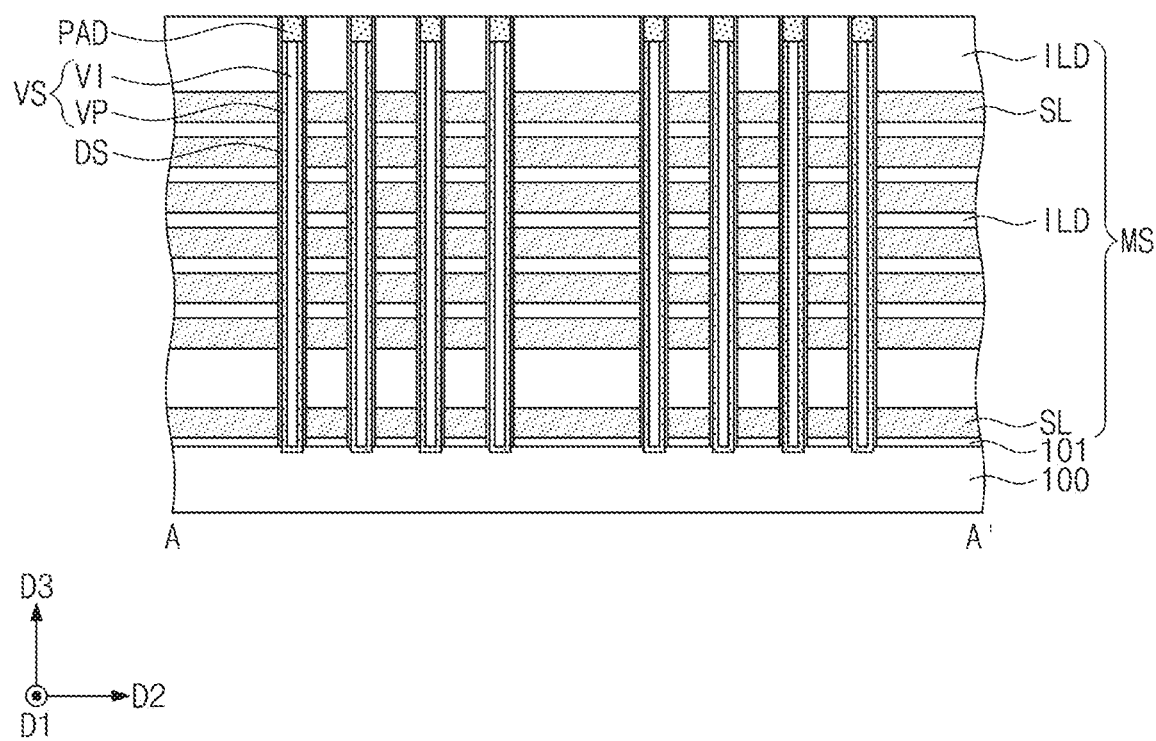
FIGS. 11A, 13A, 15A, 17A, 19A, 21A, 23A, 25A, and 27A are sectional views taken along lines A-A' of FIGS. 10, 12, 14, 16, 18, 20, 22, 24, and 26, respectively.
Figure 11B:
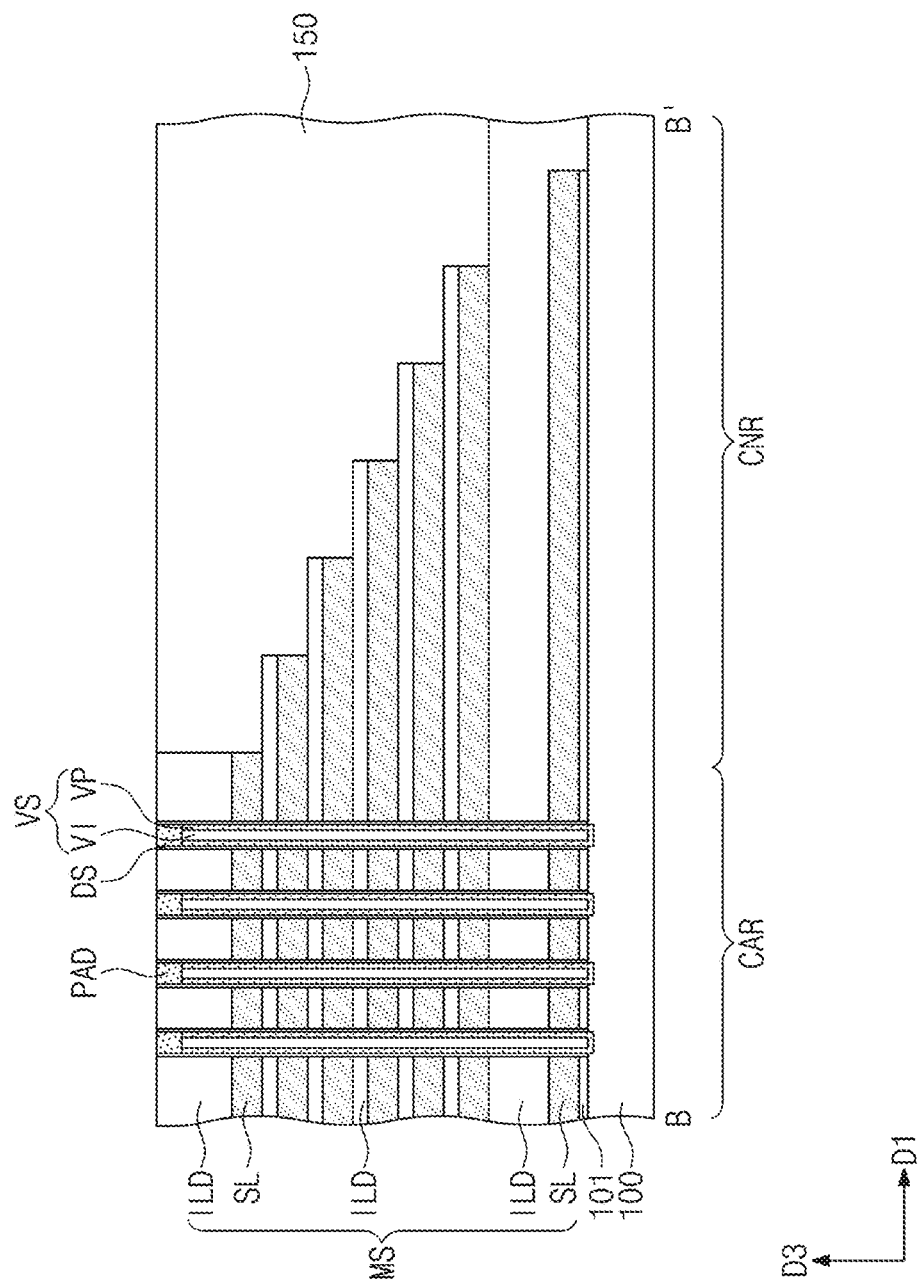
FIGS. 11B, 13B, 15B, 17B, 19B, 21B, 23B, 25B, and 27B are sectional views taken along lines B-B' of FIGS. 10, 12, 14, 16, 18, 20, 22, 24, and 26, respectively.

Referring to FIGS. 10, 11A, and 11B, a mold structure MS may be formed on the substrate 100, and then, the vertical channel structures VS and a dummy vertical structure DVS may be formed to penetrate the mold structure MS. The mold structure MS may be formed on the cell array region CAR and the connection region CNR of the substrate 100. In some embodiments, prior to the formation of the mold structure MS, the buffer insulating layer 101, which is a thermal oxide layer, may be formed on the top surface of the substrate 100.

The formation of the mold structure MS may include forming a layered structure, in which the sacrificial layers SL and the insulating layers ILD are vertically and alternately stacked, on the substrate 100, and performing a trimming process on the layered structure. As a result of the trimming process, the mold structure MS may be formed to have a stepwise structure on the connection region CNR. After the formation of the mold structure MS, the insulating planarization layer 150 may be formed on the substrate 100. The insulating planarization layer 150 may be formed to have a substantially flat top surface and may be formed of an insulating material that has an etch selectivity with respect to the sacrificial layers SL.

The vertical channel structures VS and the dummy vertical structures DVS may be formed to penetrate the mold structure MS and to be connected to the substrate 100. The vertical channel structures VS may be formed on the cell array region CAR of the substrate 100, and the dummy vertical structures DVS may be formed on the connection region CNR of the substrate 100. The formation of the vertical channel structures VS and the dummy vertical structures DVS may include forming vertical holes to penetrate the mold structure MS and the buffer insulating layer 101 and to expose the substrate 100, and forming the semiconductor pattern VP, the insulating filling pattern VI, and the conductive pattern PAD in each of the vertical holes. The vertical holes may be formed by forming a mask pattern (not shown) on the mold structure MS and performing an anisotropic etching process using the mask pattern as an etch mask.

The formation of the semiconductor pattern VP may include depositing a semiconductor layer of a uniform thickness, in the vertical holes with the memory layer DS. In some embodiments, the semiconductor layer may be conformally formed to a thickness that is too thin to completely fill the vertical holes. Thus, the semiconductor pattern VP may define empty spaces in the vertical holes, and the empty space may be filled with the insulating filling pattern VI or the air. In some embodiments, the conductive pattern PAD may be formed in or on an upper portion of the semiconductor pattern VP. The conductive pattern PAD may be an impurity doped region or may be formed of a conductive material. Although not shown, a selective epitaxial growth (SEG) process may further be performed to form a lower semiconductor pattern between the semiconductor pattern VP and the substrate 100. Thus, the vertical channel structures VS may be formed in the vertical holes on the cell array region CAR of the substrate 100, and the dummy vertical structures DVS may be formed in the vertical holes on the connection region CNR.

Figure 13A:
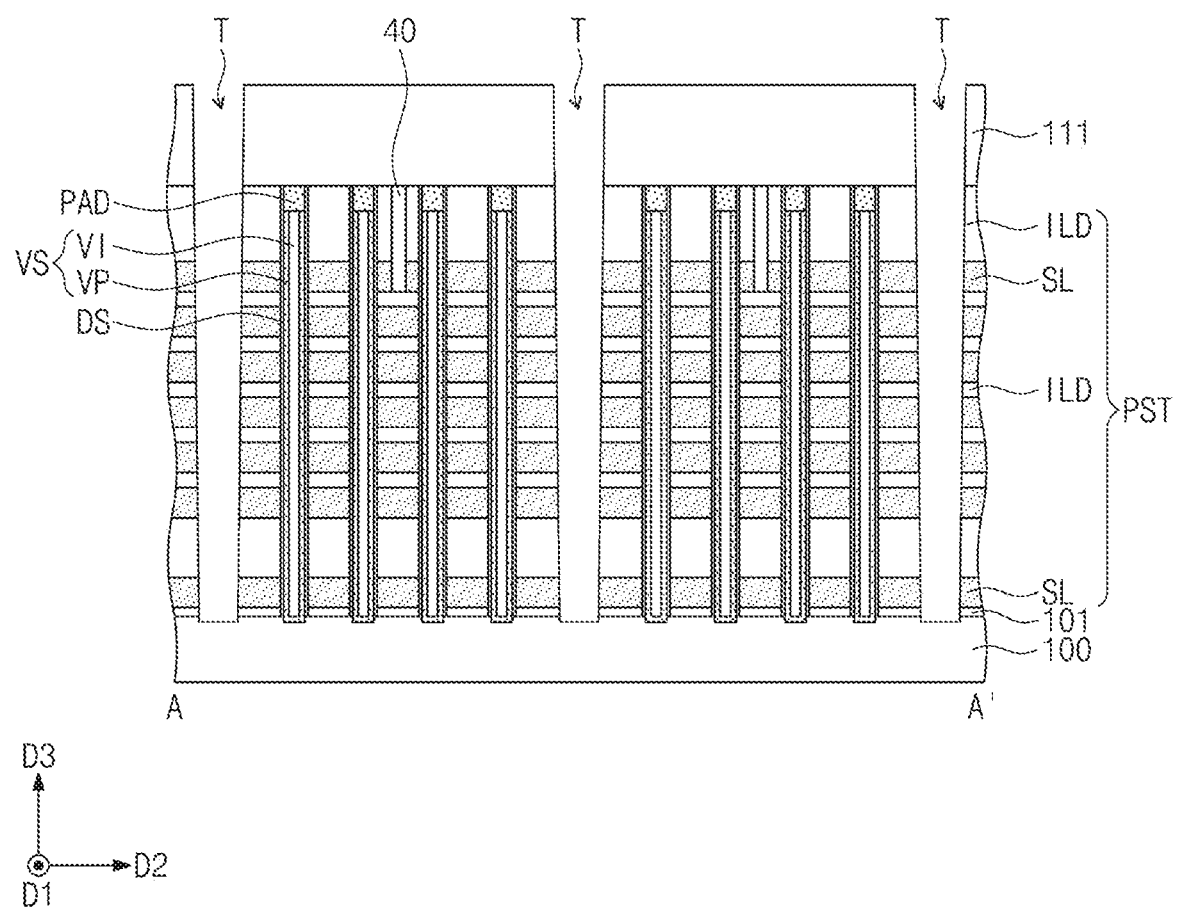
Figure 13B:
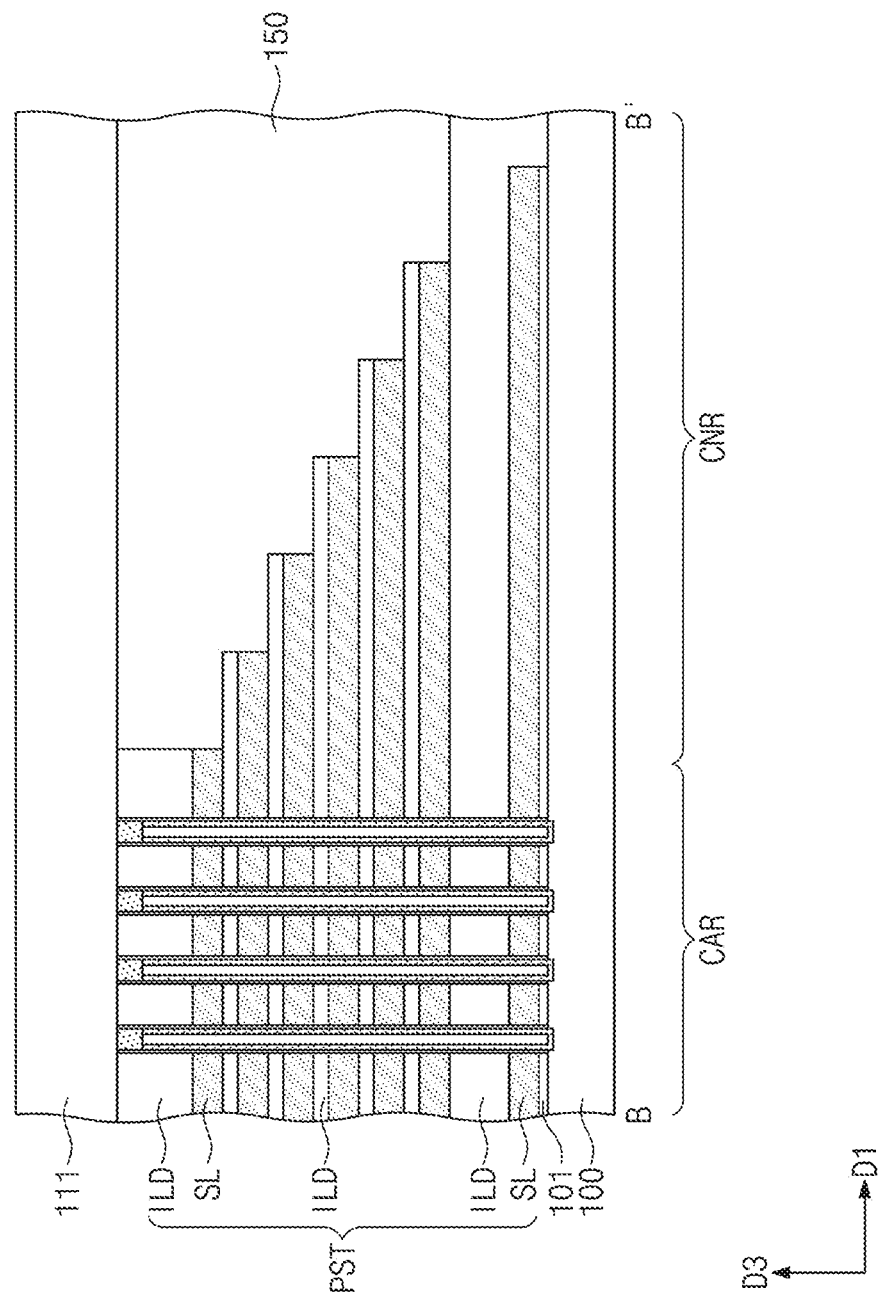

Referring to FIGS. 12, 13A, and 13B, the mold structure MS may be patterned to form a plurality of preliminary stacks PST from the mold structure MS. A trench T may be formed between the preliminary stacks PST. The formation of the trench T may include forming the first interlayered insulating layer 111 to cover top surfaces of the vertical channel structures VS and sequentially etching the sacrificial layers SL and the insulating layers ILD using the first interlayered insulating layer 111 as an etch mask.

The trenches T may be extended in the first direction D1 and may be spaced apart from each other in the second direction D2. The trenches T may be formed to be spaced apart from the vertical channel structures VS and to expose sidewalls of the sacrificial layers SL and the insulating layers ILD. The trenches T may be formed to have a line or rectangular shape. The preliminary stacks PST may be line-shaped structures, which are extended along the trench T or in the first direction D1. The preliminary stacks PST may be spaced apart from each other in the second direction D2, with the trench T interposed therebetween. Accordingly, each of the preliminary stacks PST may include the sacrificial layers SL and the insulating layers ILD, which are alternately stacked on the substrate 100. In some embodiments, the trench T may be formed in an over-etching manner, and in this case, the top surface of the substrate 100 exposed through the trench T may be recessed to a specific depth.

In some embodiments, the vertical channel structures VS in one preliminary stack PST may form a particular number of columns (e.g., nine columns) that are parallel to the first direction D1. In some embodiments, the vertical channel structures VS in a particular column (e.g., the fifth column) may not be connected to the bit line BL. In some embodiments, the insulating separation pattern 40 extending in the first direction D1 may be formed on each of the mold structures MS. The insulating separation pattern 40 may be formed to cut at least one of the sacrificial layers SL, which are placed in an upper portion of the preliminary stack PST.

Figure 14:
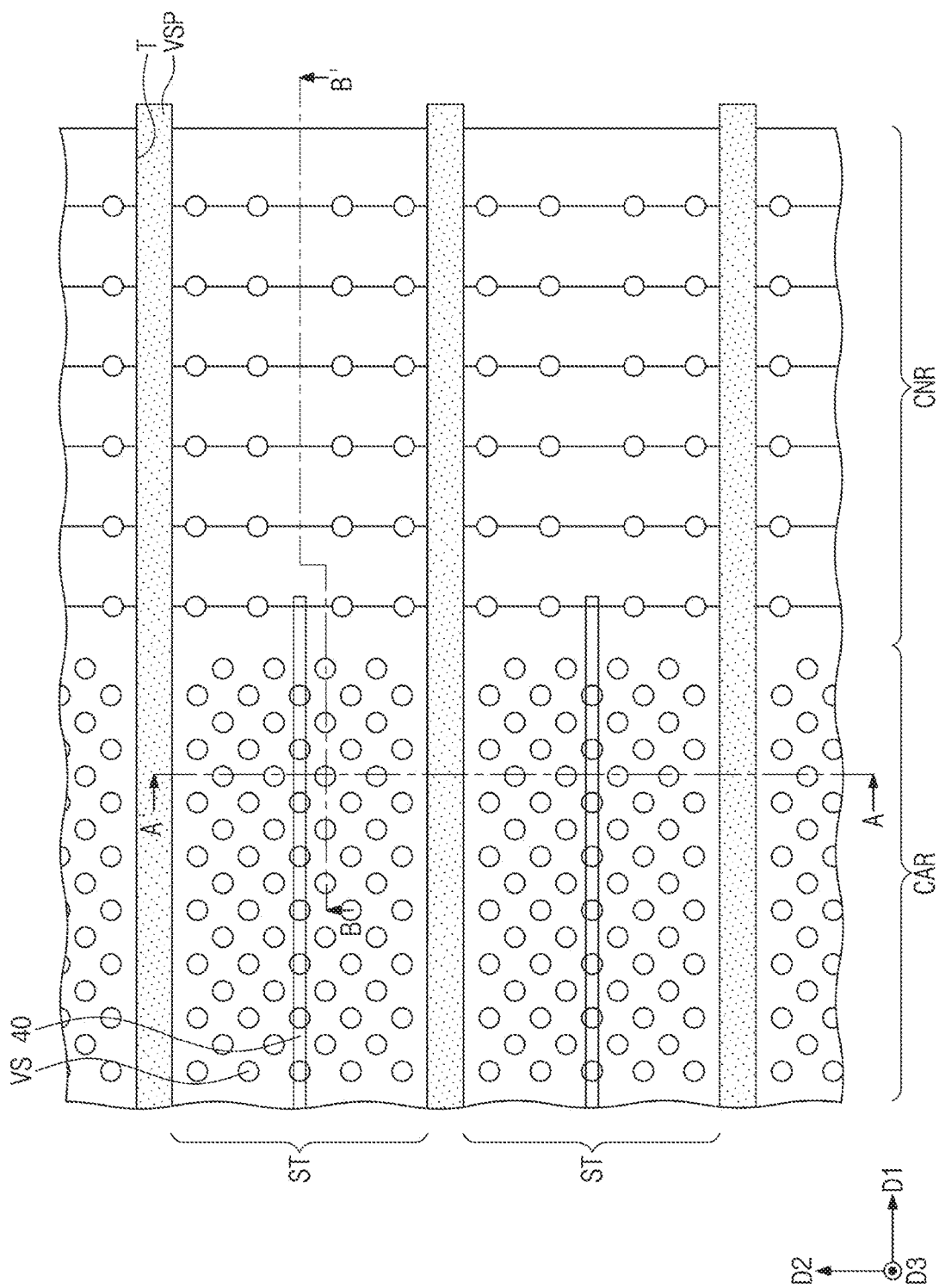
Figure 15A:
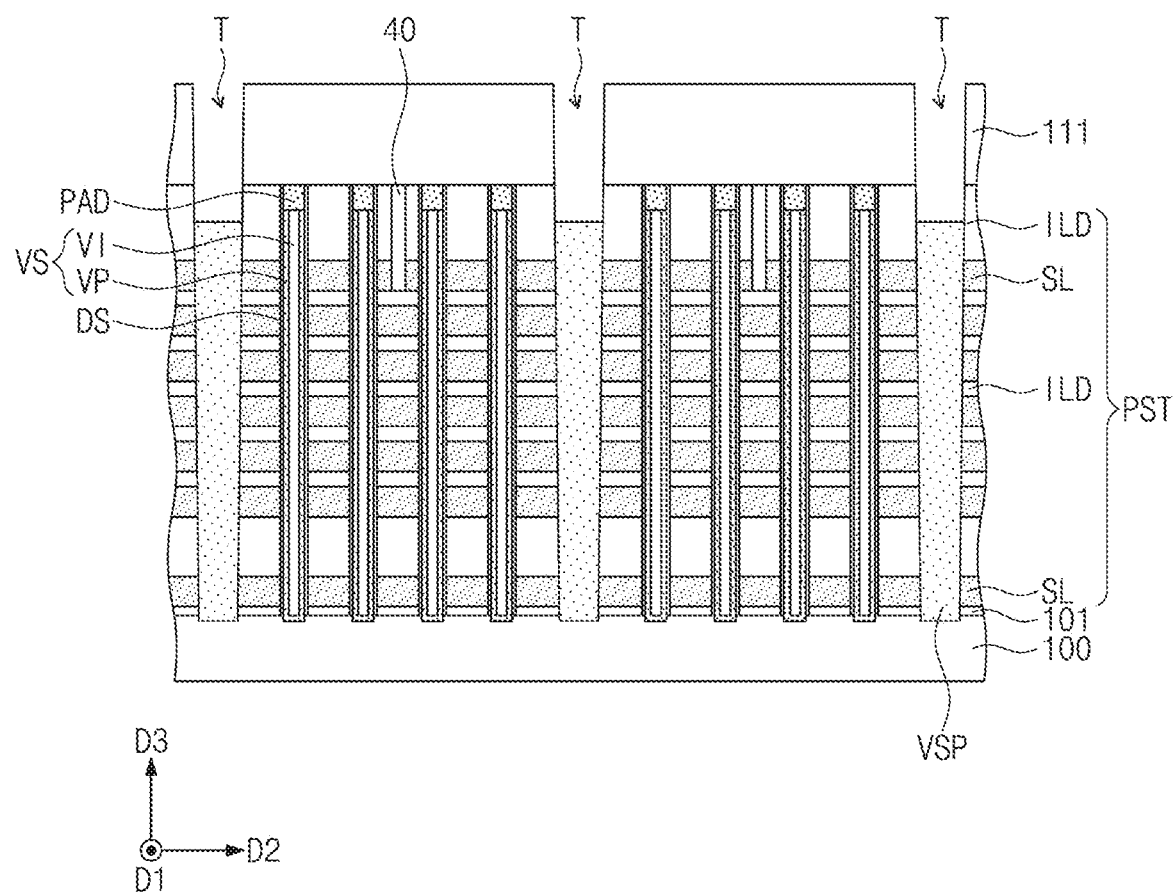
Figure 15B:
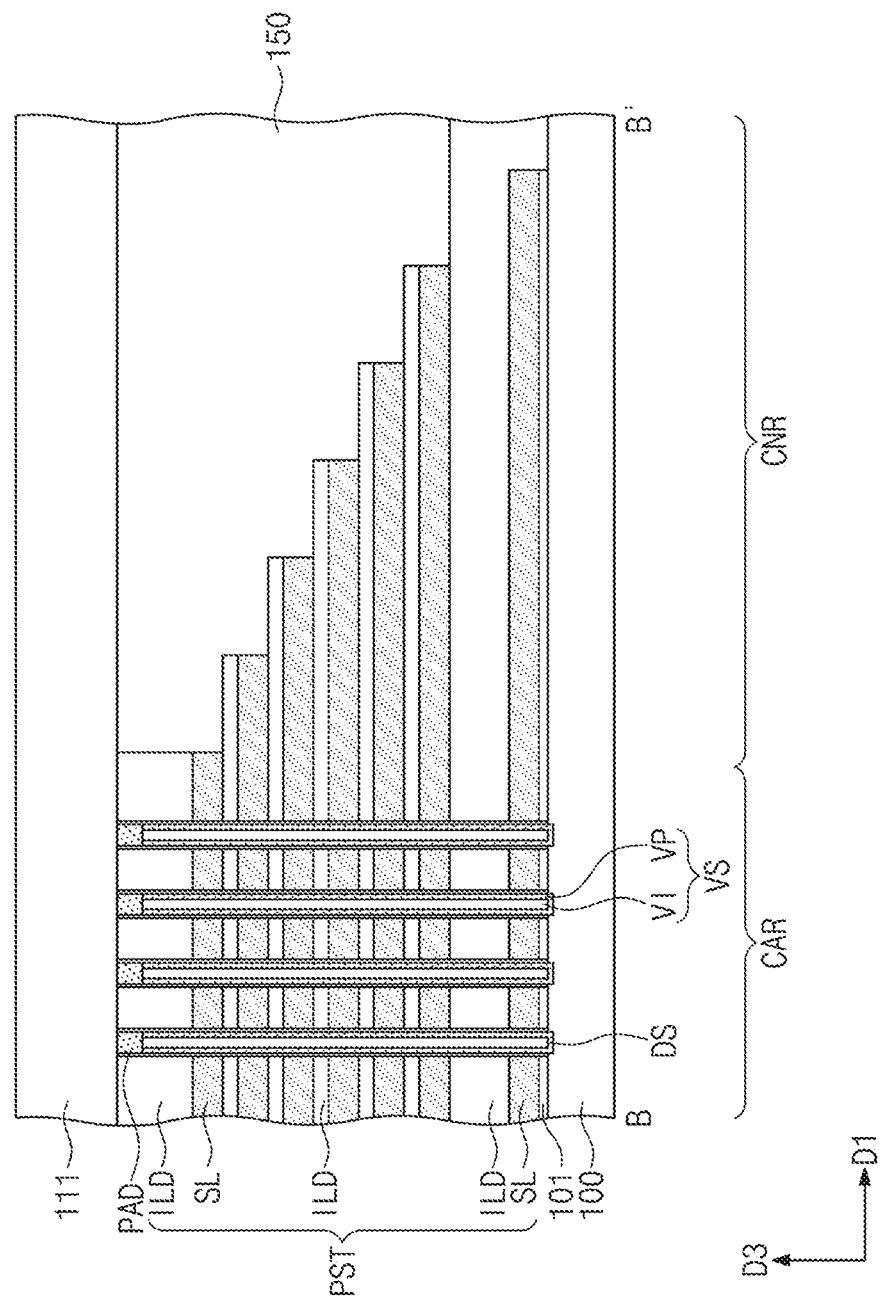

Referring to FIGS. 14, 15A, and 15B, vertical sacrificial patterns VSP may be formed between the preliminary stacks PST. The formation of the vertical sacrificial patterns VSP may include forming a first gap-fill layer (not shown) to fill the trench T and to cover a top surface of the first interlayered insulating layer 111 and then performing a planarization process and/or an etch-back process on the first gap-fill layer to remove a portion of the first gap-fill layer. A top surface of the vertical sacrificial pattern VSP may be positioned at a level lower than a bottom surface of the first interlayered insulating layer 111. The top surface of the vertical sacrificial pattern VSP may be positioned at a level higher than a top surface of the uppermost one of the sacrificial layers SL.

Figure 16:
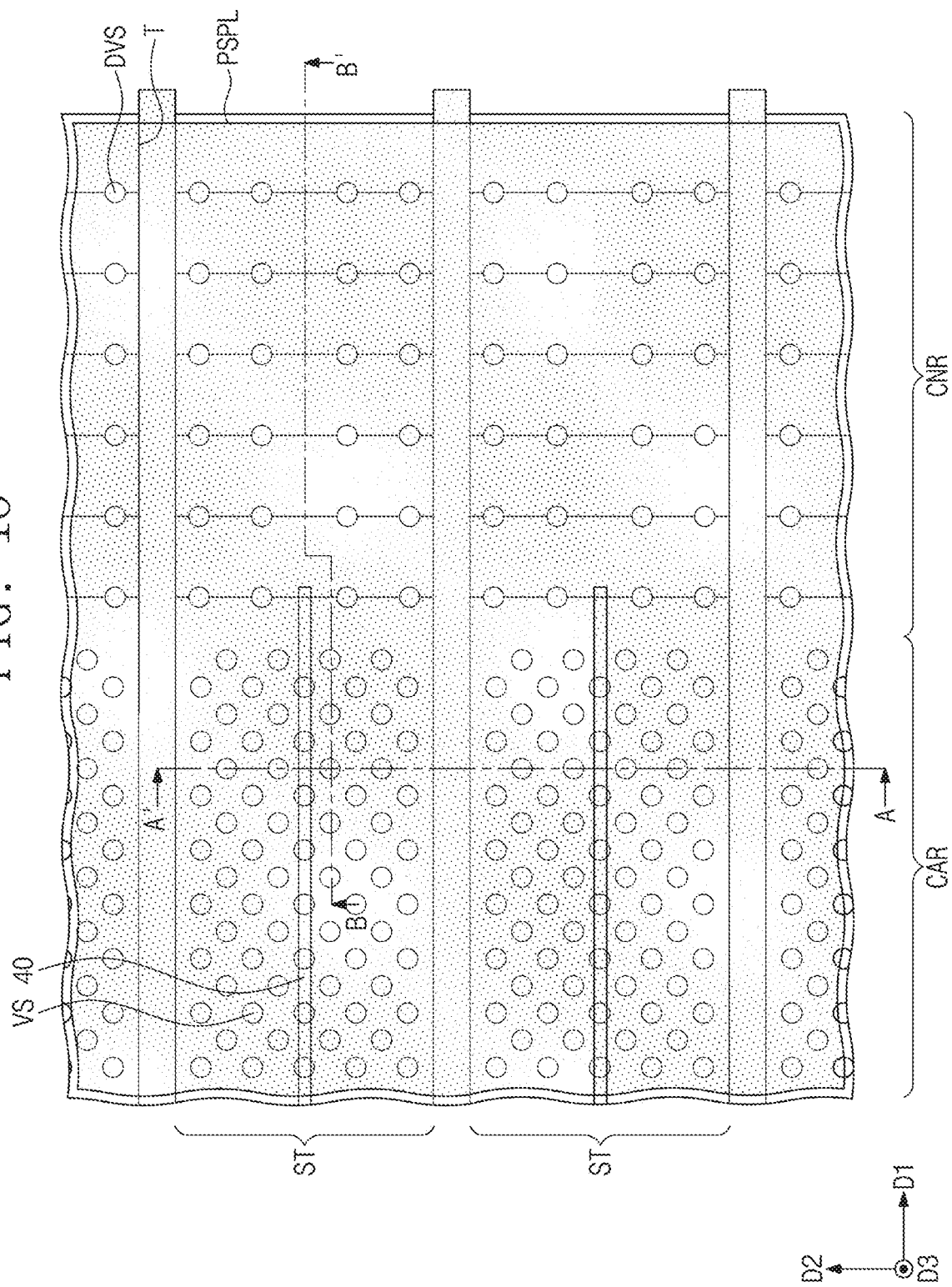
Figure 17A:
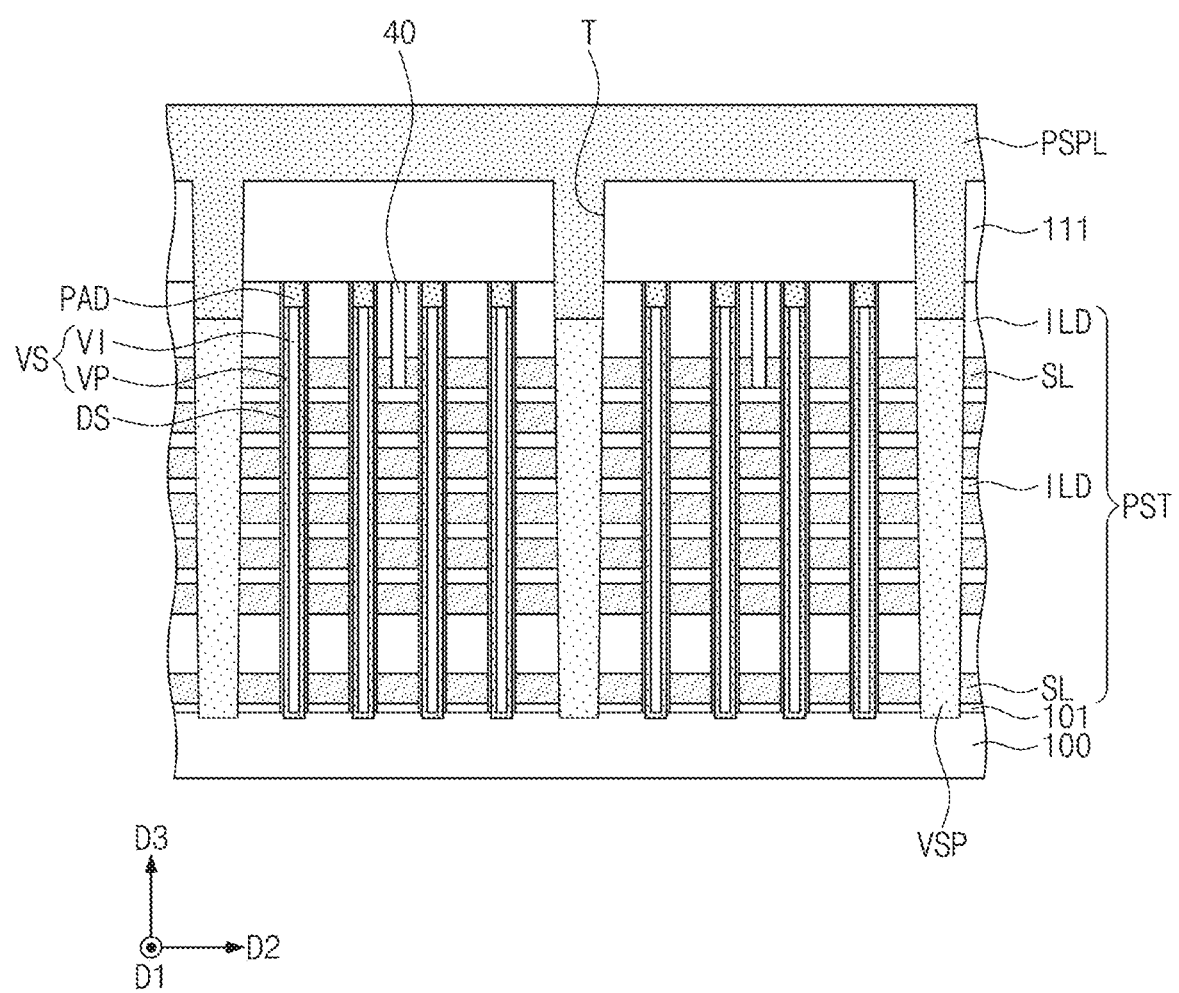
Figure 17B:
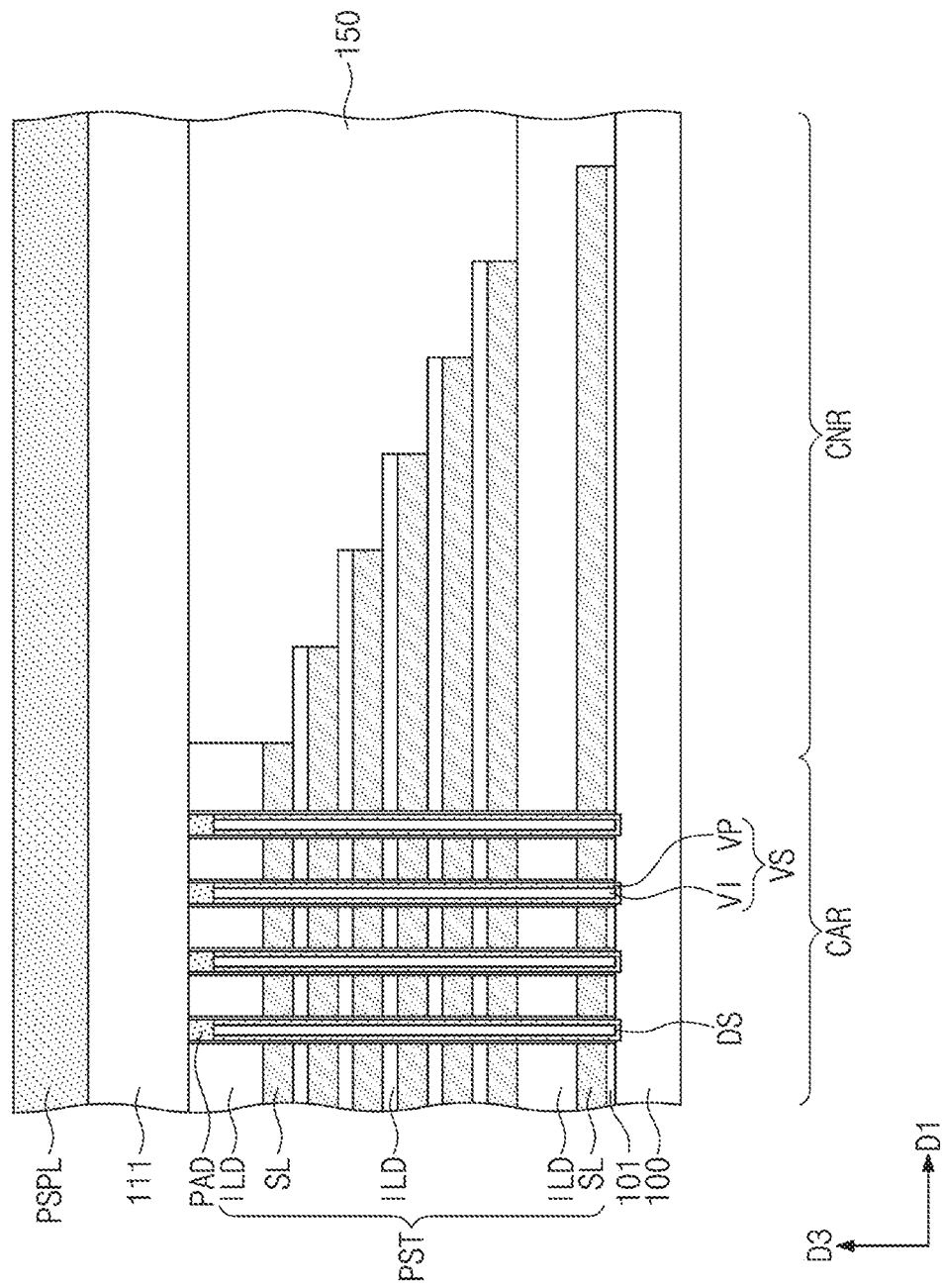

Referring to FIGS. 16, 17A, and 17B, a second gap-fill layer PSPL may be formed on the first interlayered insulating layer to fill a remaining space of the trench T. The second gap-fill layer PSPL may be formed of an insulating material that has an etch selectivity with respect to the sacrificial layers SL and the vertical sacrificial patterns VSP. For example, the second gap-fill layer PSPL may be formed of at least one of silicone-based materials (e.g., spin-on-hardmask (SOH) materials), carbon-based materials (e.g., amorphous carbon layer (ACL)), a polycrystalline silicon, or photoresist materials.

Figure 18:
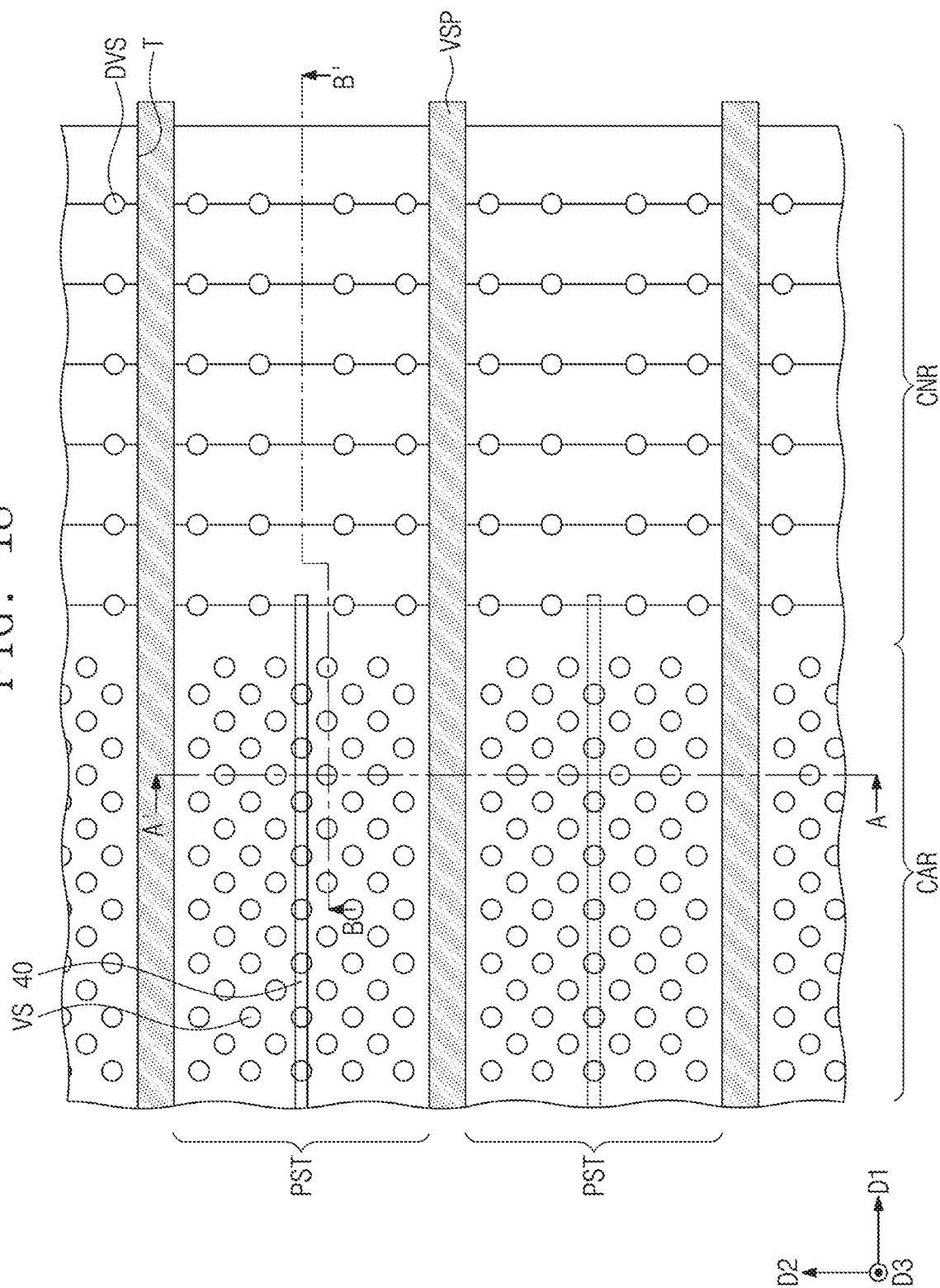
Figure 19A:
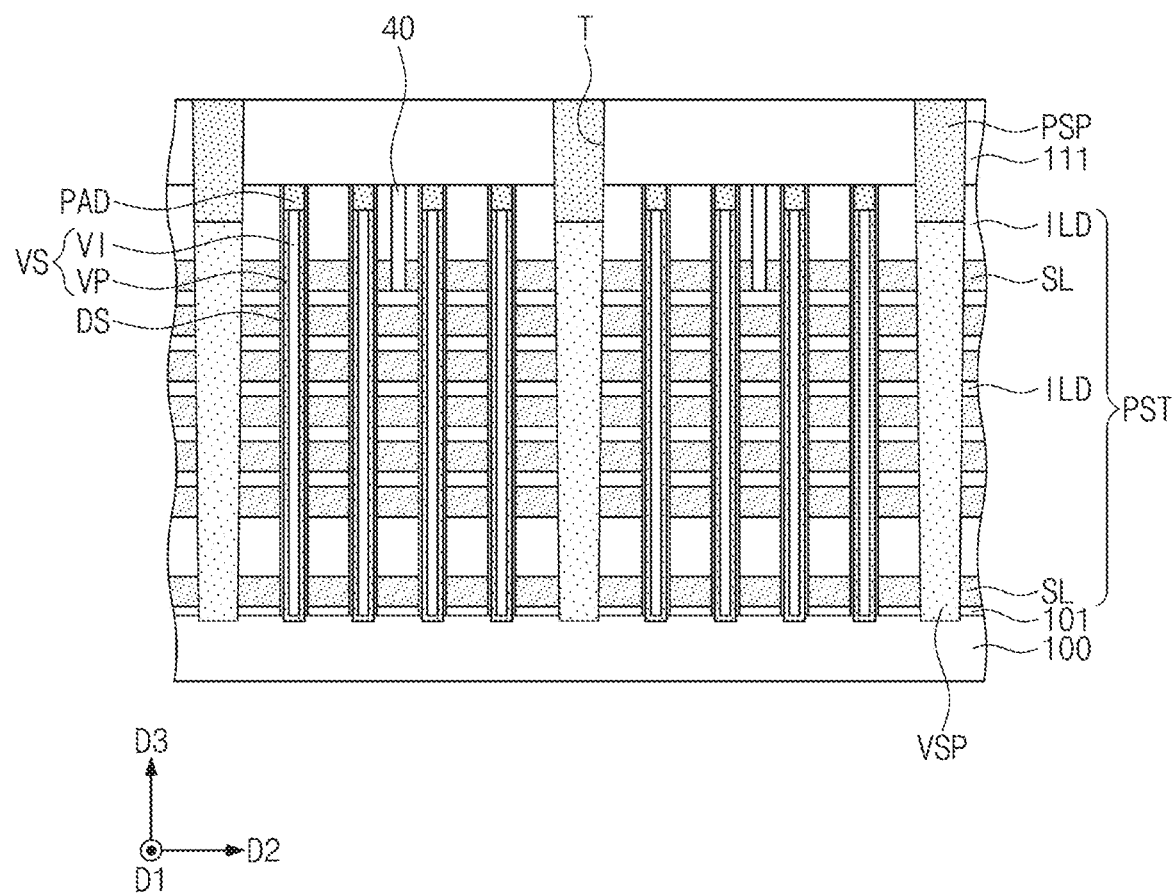
Figure 19B:
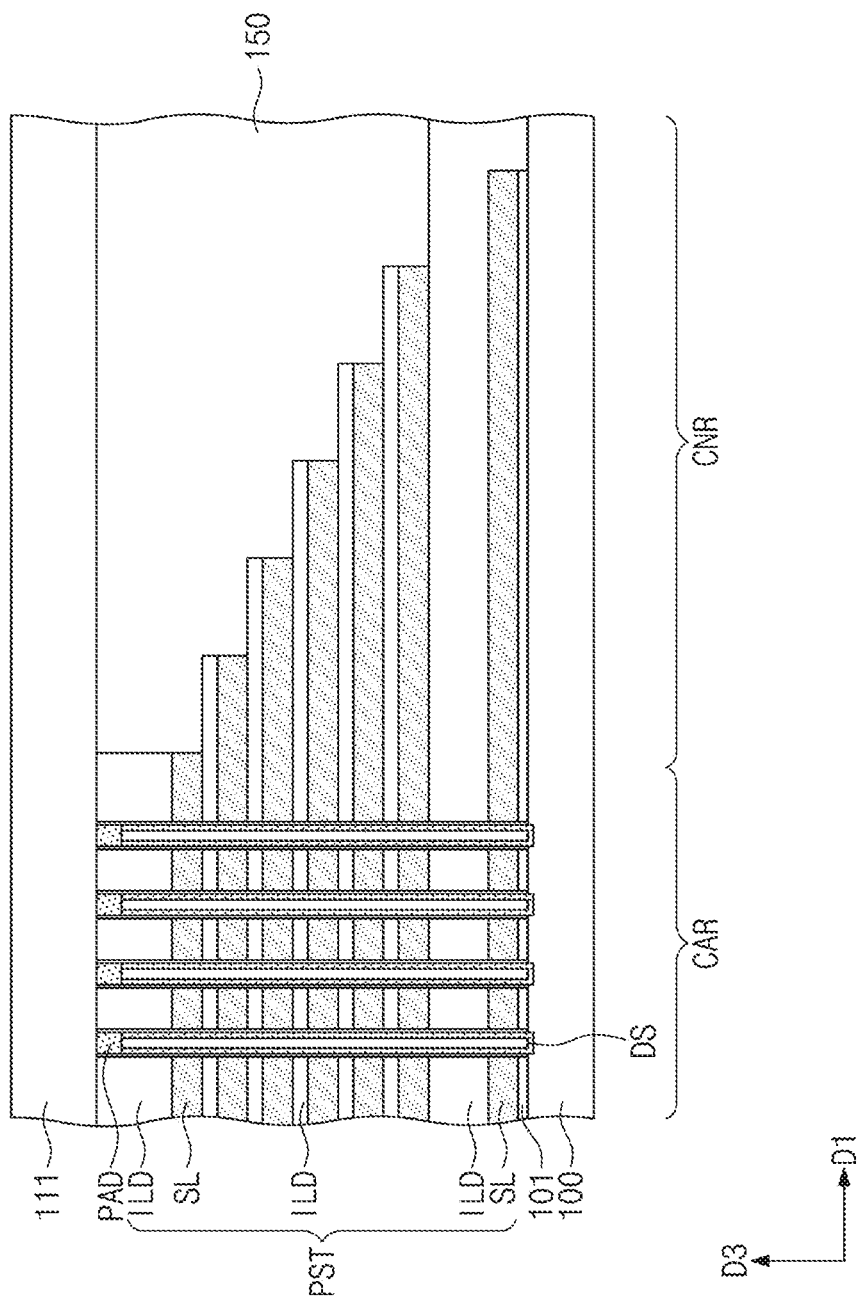
Figure 20:
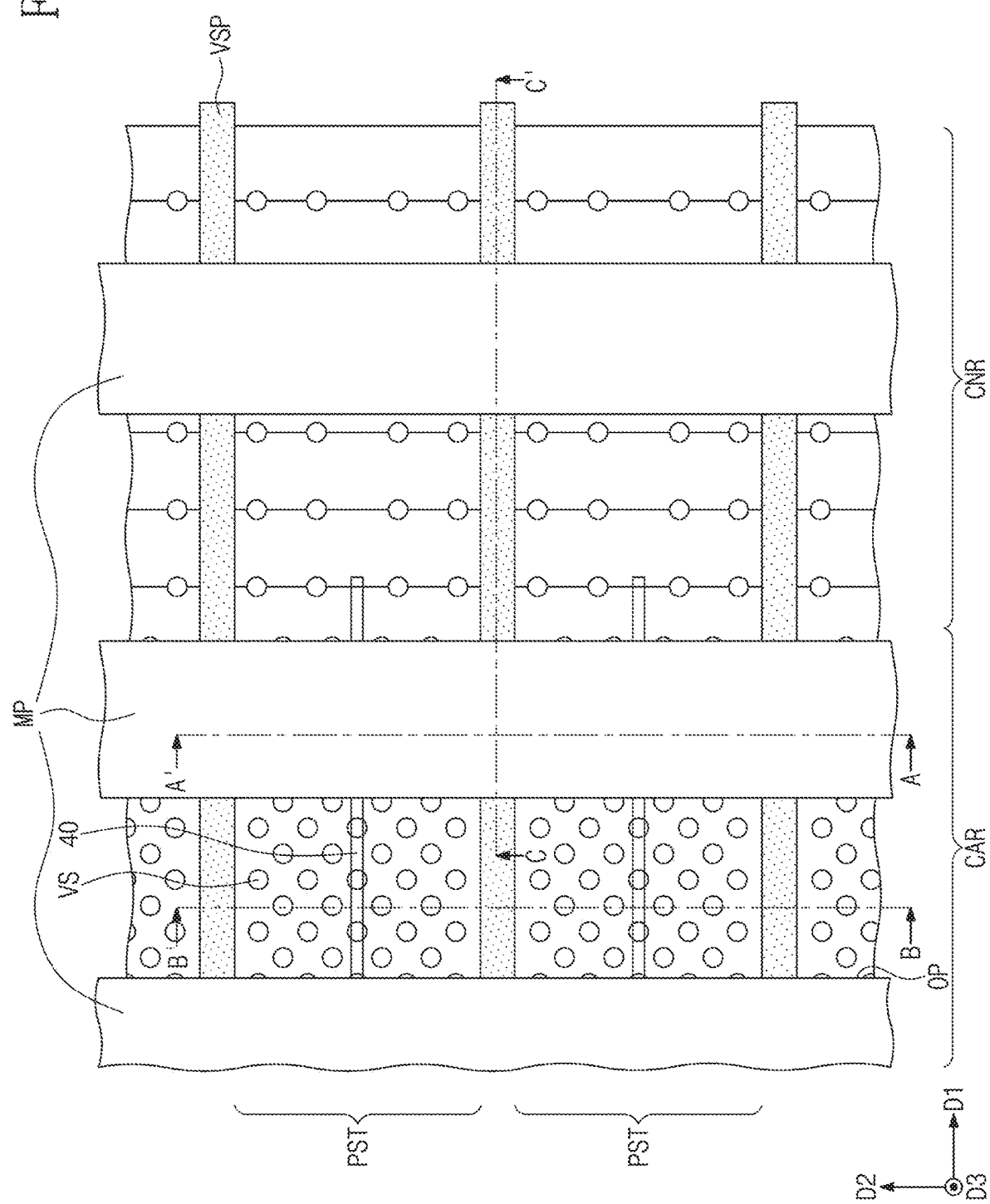
Figure 21A:
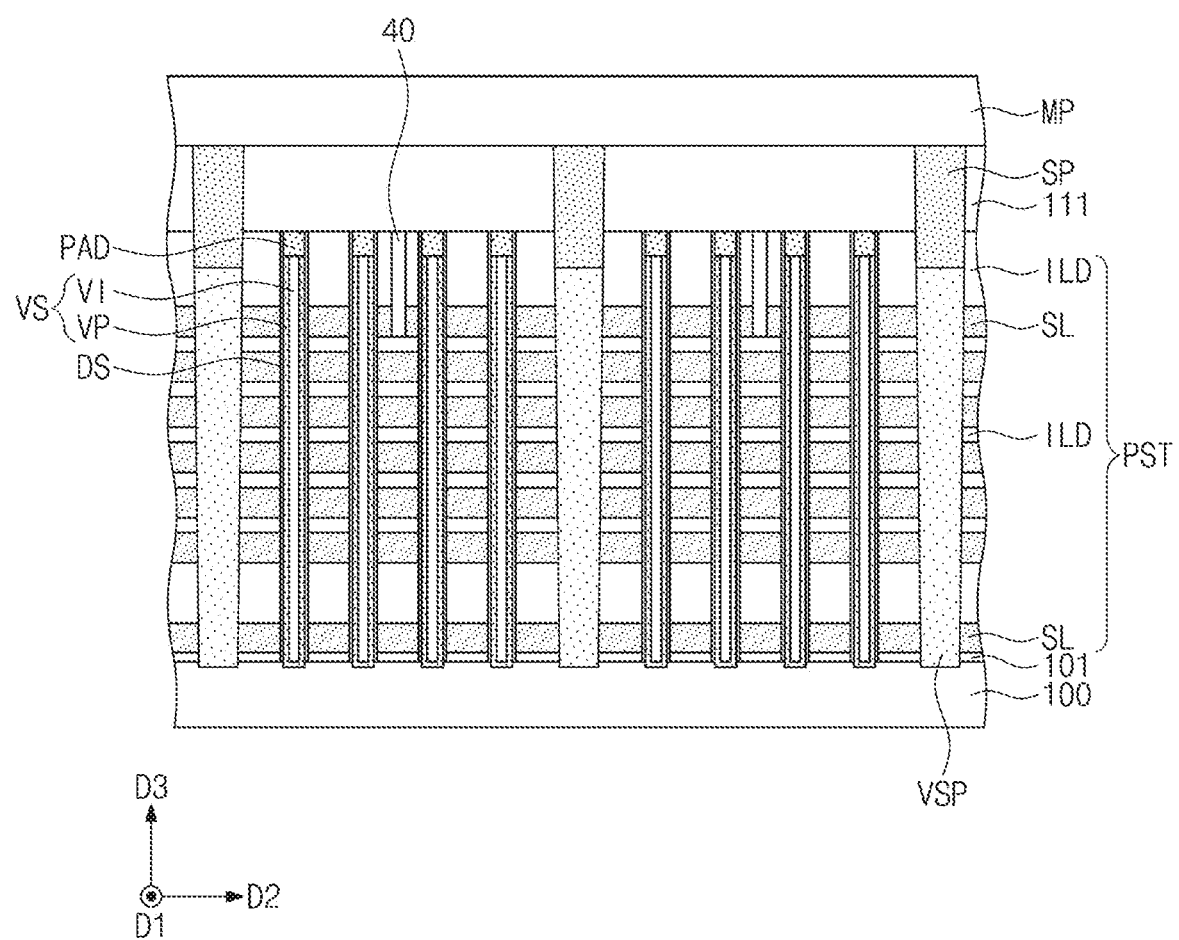
Figure 21B:
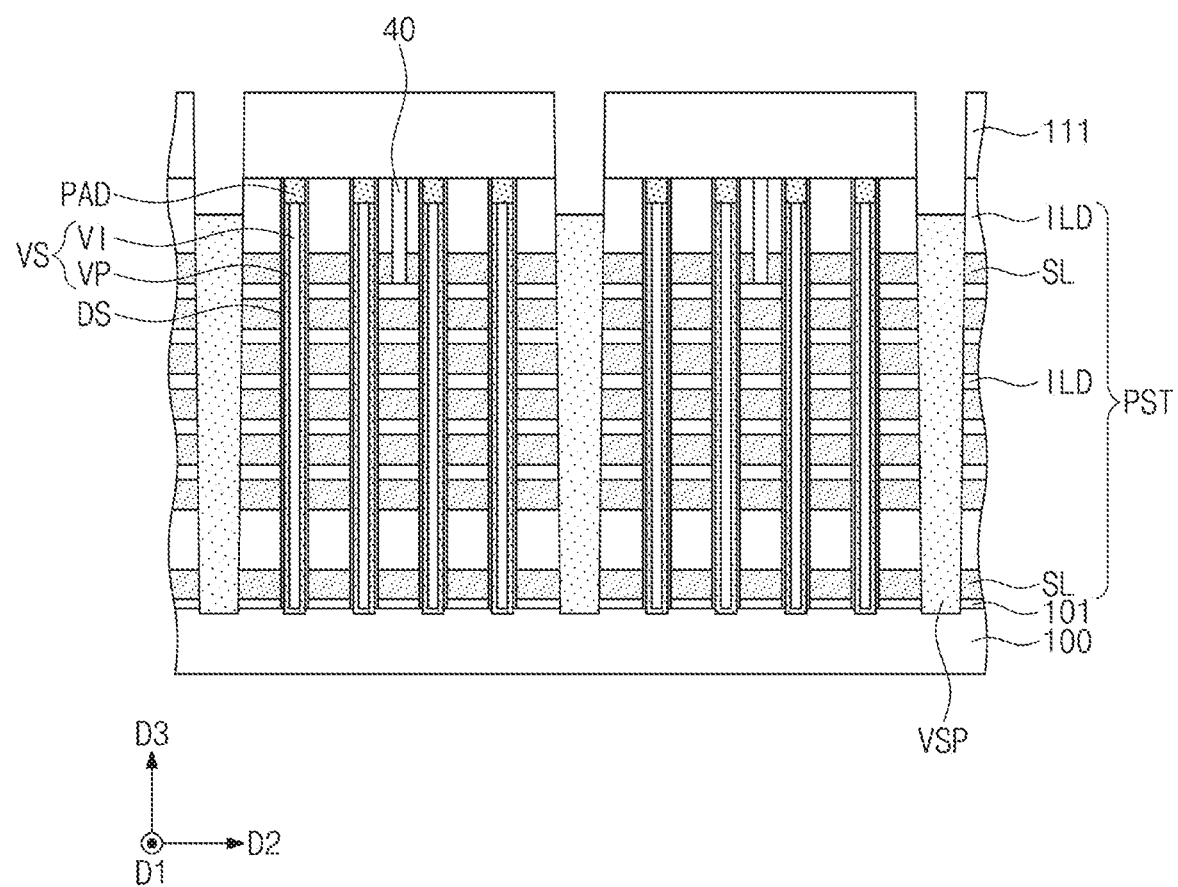
Figure 21C:
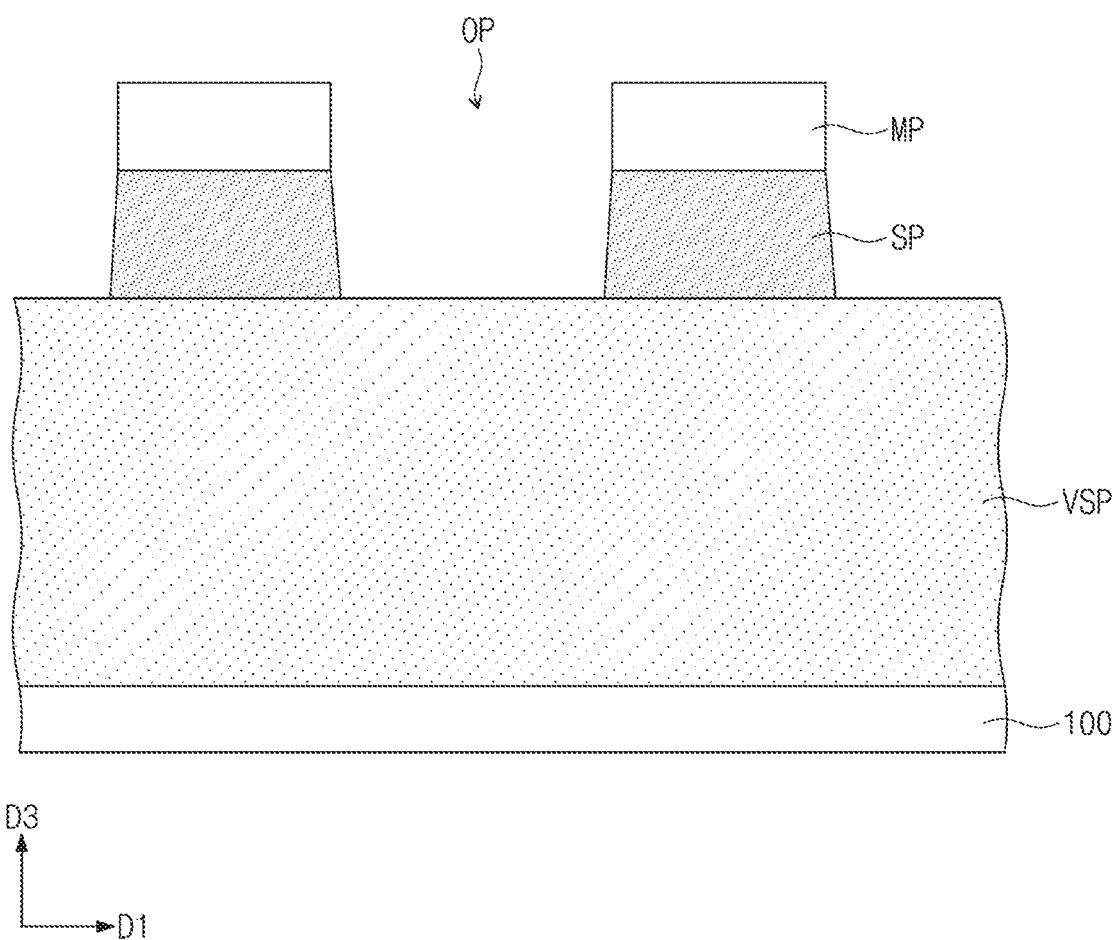

Referring to FIGS. 18, 19A, and 19B, a preliminary support pattern PSP may be formed by removing a portion of the second gap-fill layer PSPL. The removal of the portion of the second gap-fill layer PSPL may be performed using a planarization process. Accordingly, the preliminary support pattern PSP may be formed to have a top surface that is coplanar with the top surface of the first interlayered insulating layer 111. The preliminary support pattern PSP may fill a remaining space of the trench T, in which the vertical sacrificial pattern VSP is formed, and may extend in the first direction D1. The preliminary support patterns PSP may be spaced apart from each other in the second direction D2.

Referring to FIGS. 20, 21A, 21B, and 21C, a mask pattern MP may be formed on the first interlayered insulating layer 111, and an etching process may be performed to form the support pattern SP from the preliminary support patterns PSP.

The mask pattern MP may be formed to cover a portion of the preliminary support patterns PSP. The mask pattern MP may have an opening OP extending in the second direction D2. The opening OP may be formed to partially expose the top surfaces of the preliminary support patterns PSP. Thereafter, a selective etching process using the mask pattern MP as an etch mask may be performed on the preliminary support patterns PSP. Thus, the support patterns SP, which are arranged in the first direction D1, may be formed. The support patterns SP may partially expose a top surface of the vertical sacrificial pattern VSP. In some embodiments, the support patterns SP may be formed such that their width in the first direction D1 increases with decreasing distance from the substrate 100.

Figure 22:
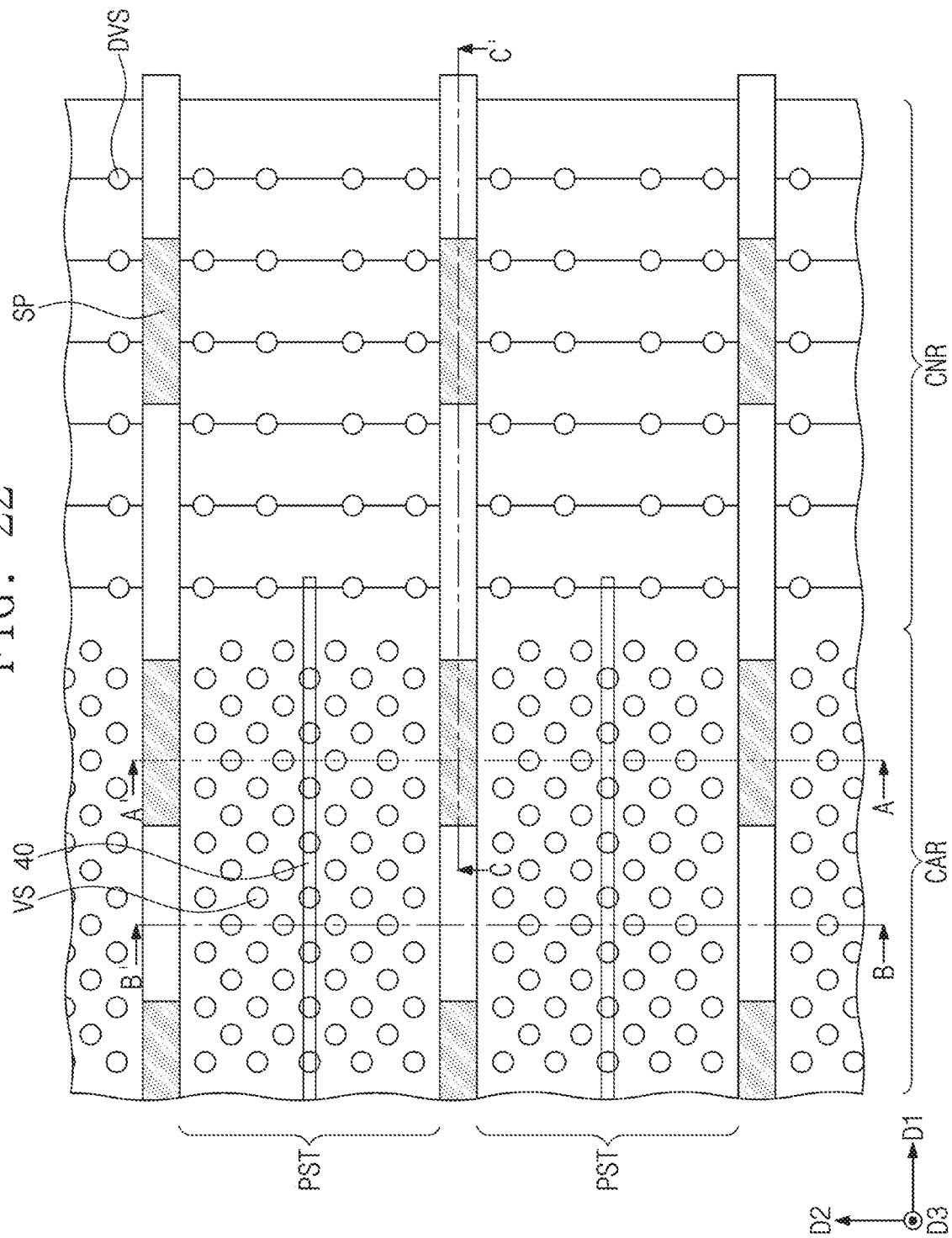
Figure 23A:
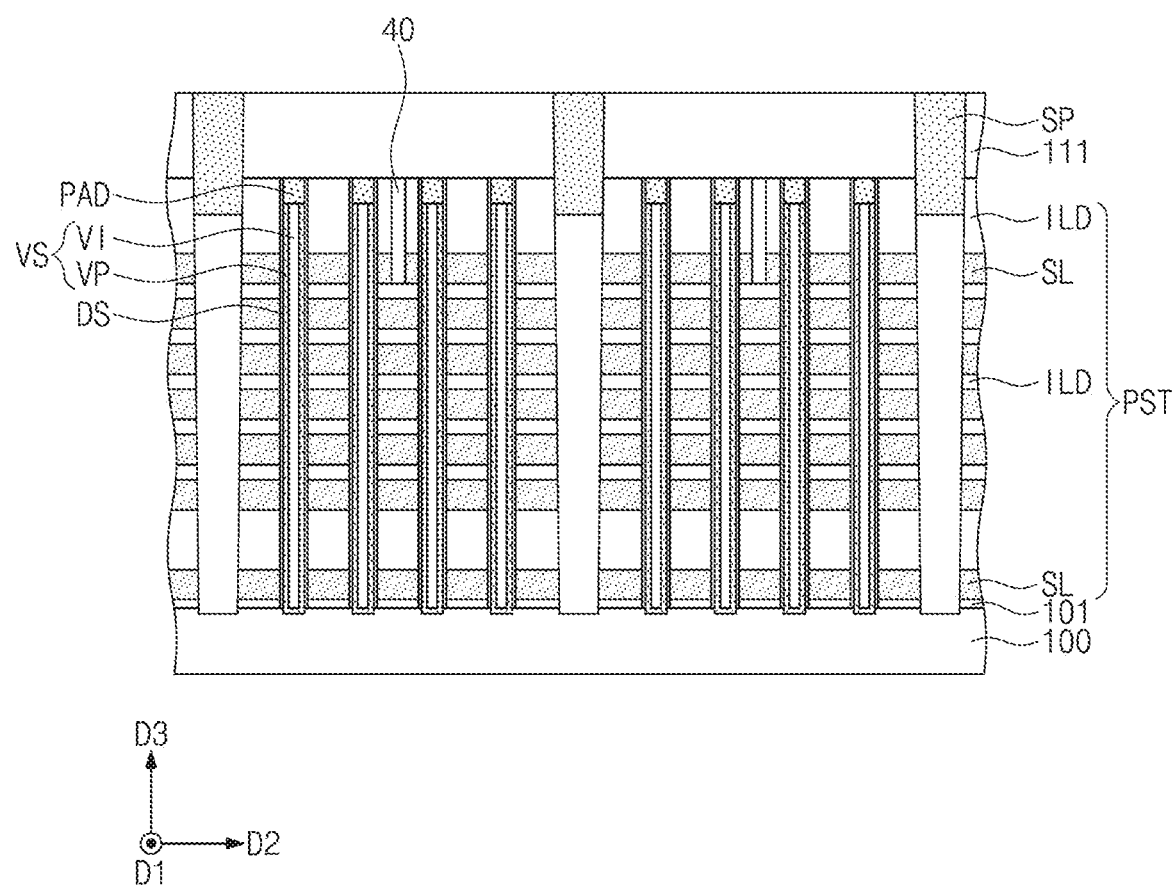
Figure 23B:
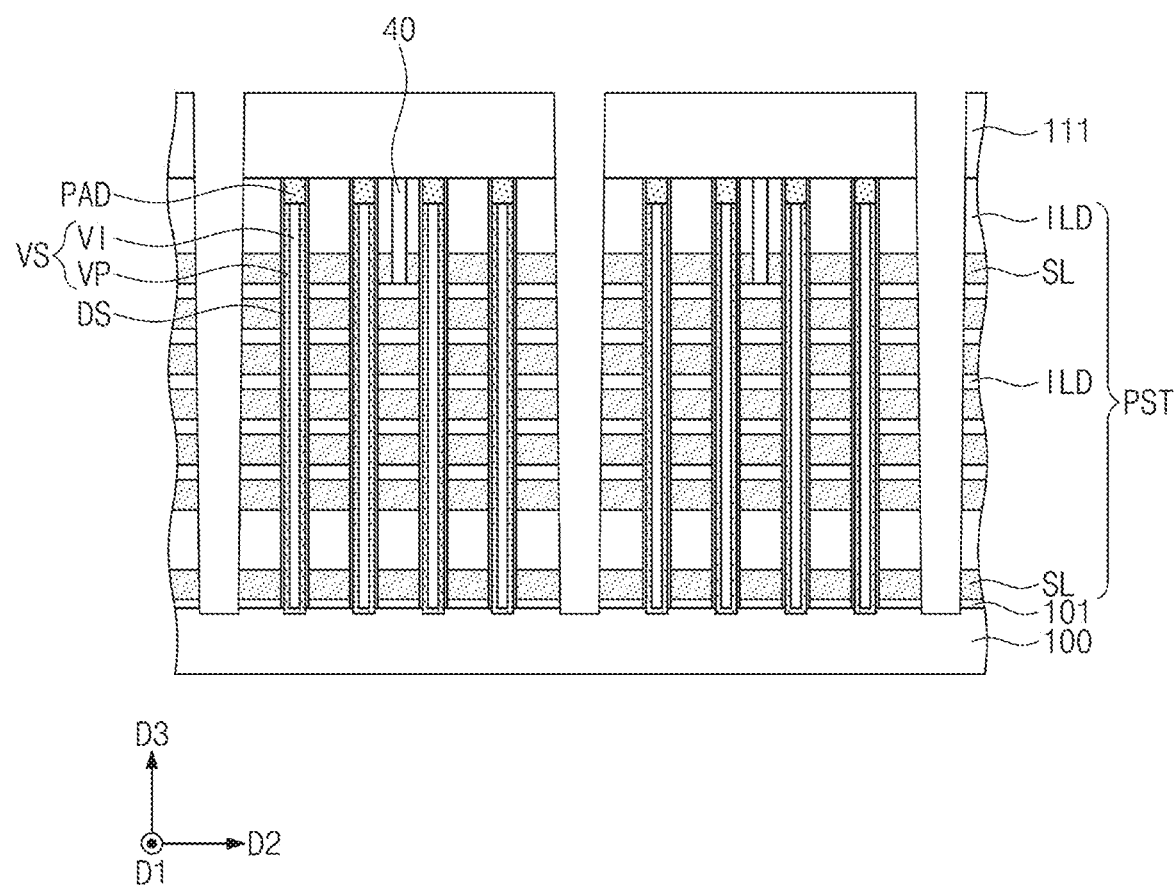

Referring to FIGS. 22, 23A, and 23B, the vertical sacrificial pattern VSP may be removed. The removing of the vertical sacrificial pattern VSP may be performed using, for example, a wet etching process. As a result of the removal of the vertical sacrificial patterns VSP, opposite sidewalls of the preliminary stacks PST may be exposed. The support patterns SP may have bottom surfaces positioned at a level higher than the uppermost sacrificial layer SL in the preliminary stack PST, and thus, the support patterns SP may not cover the sidewalls of the sacrificial layers SL.

Figure 24:
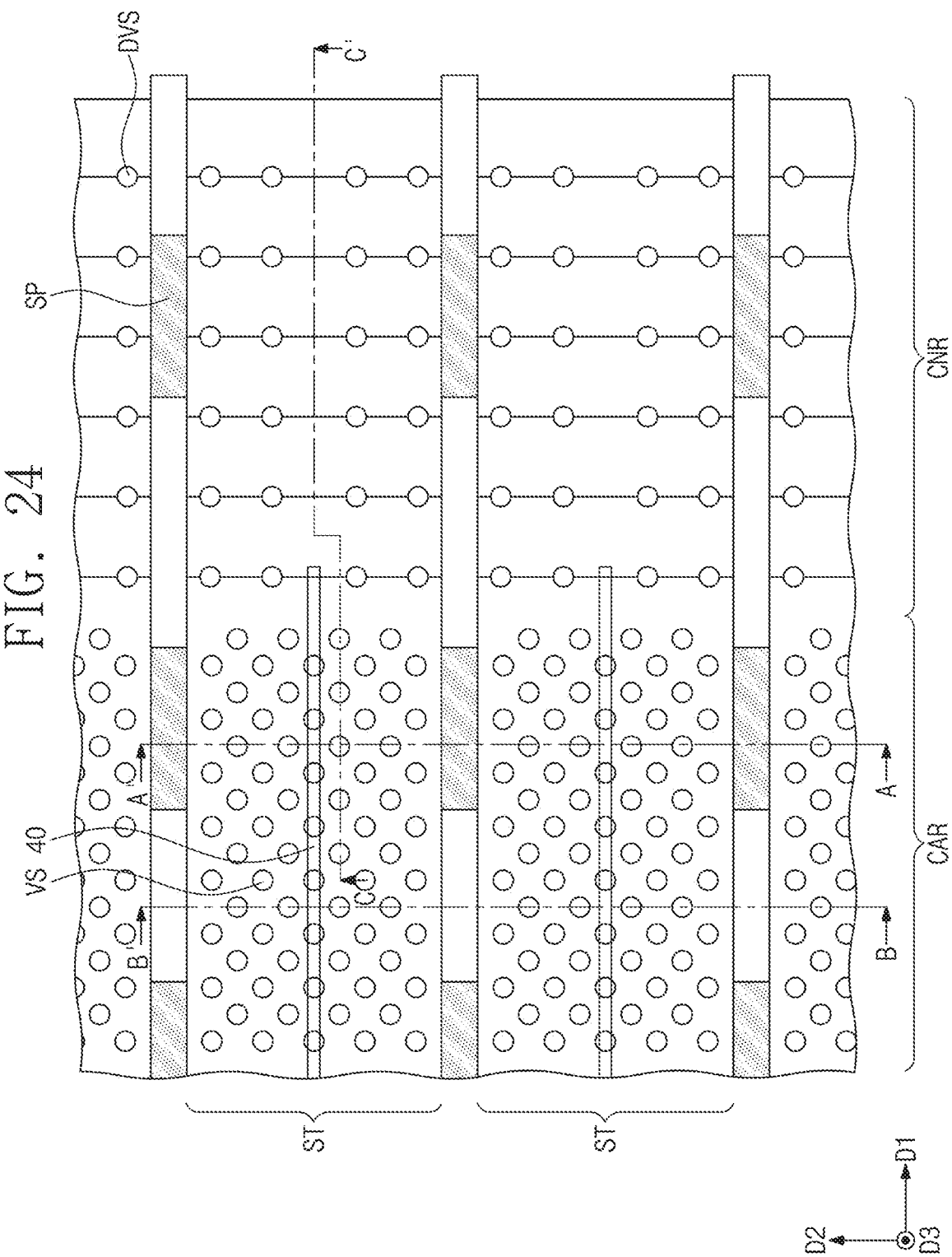
Figure 25A:
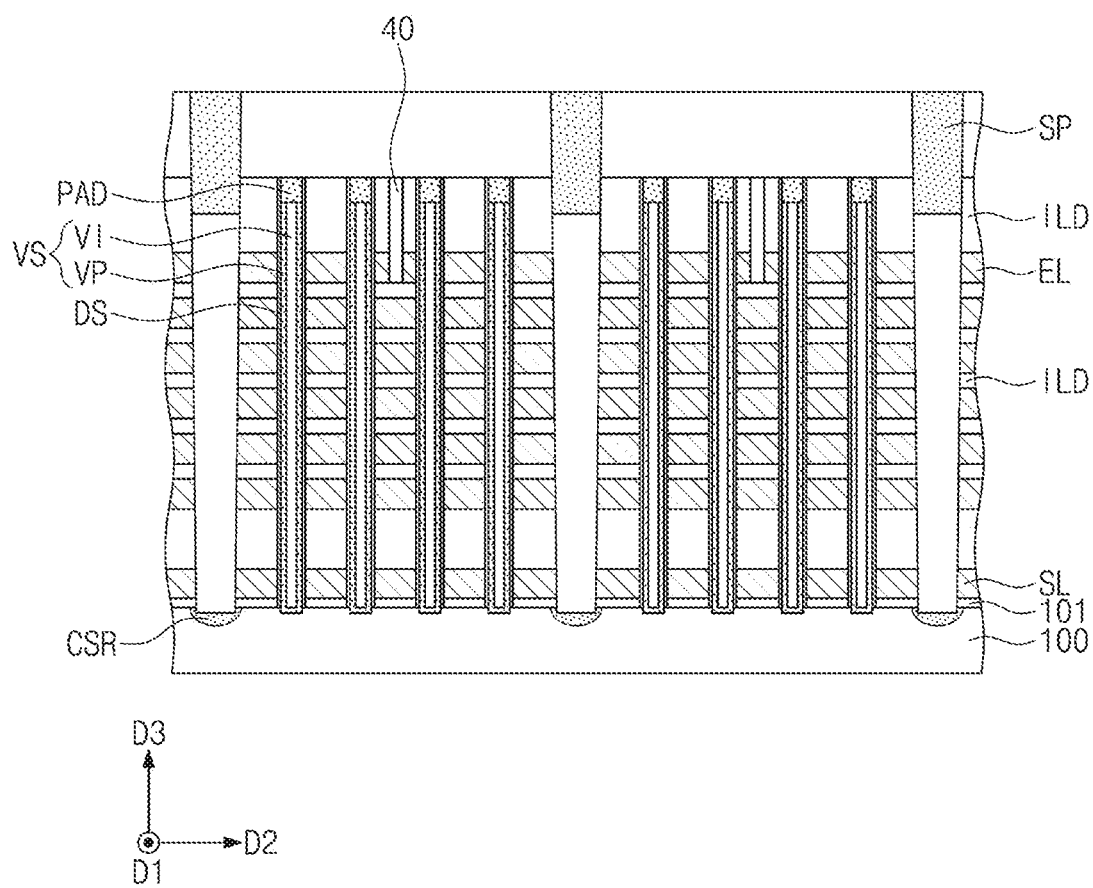
Figure 25B:
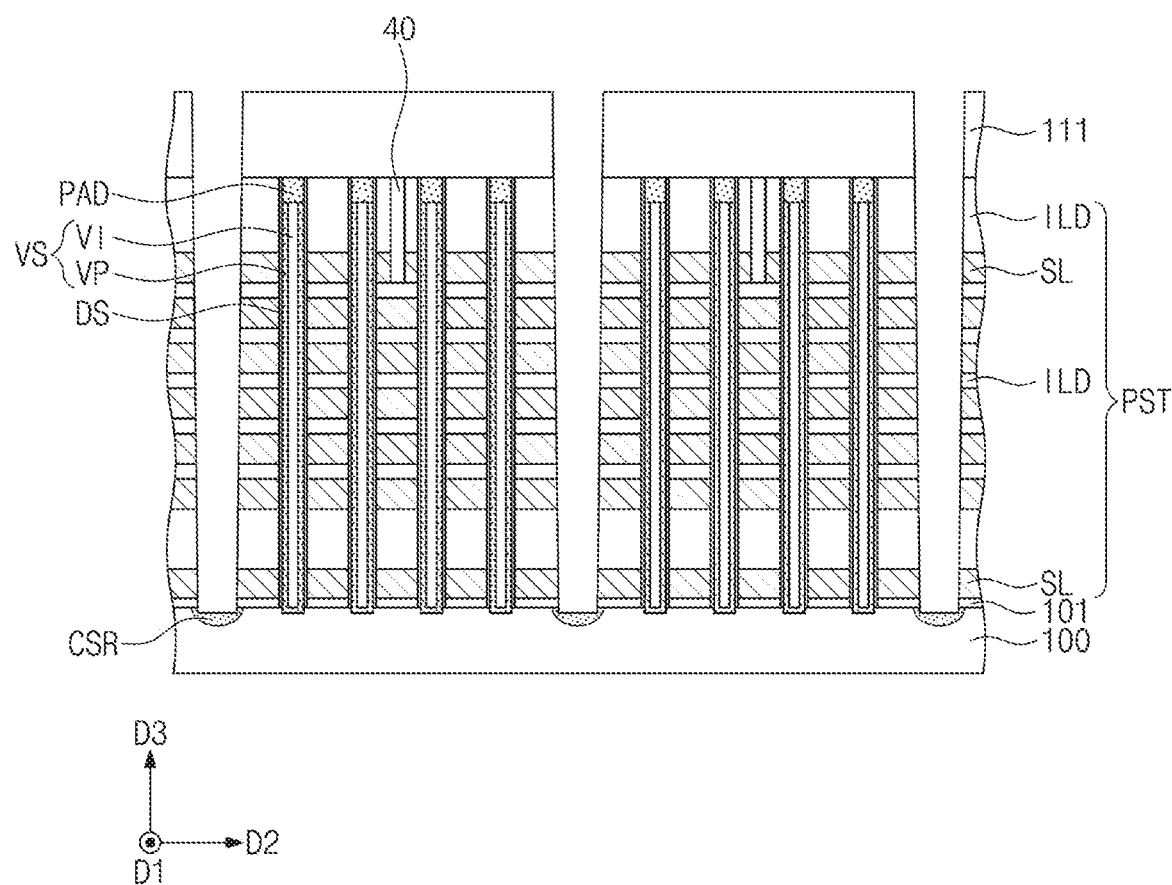
Figure 25C:
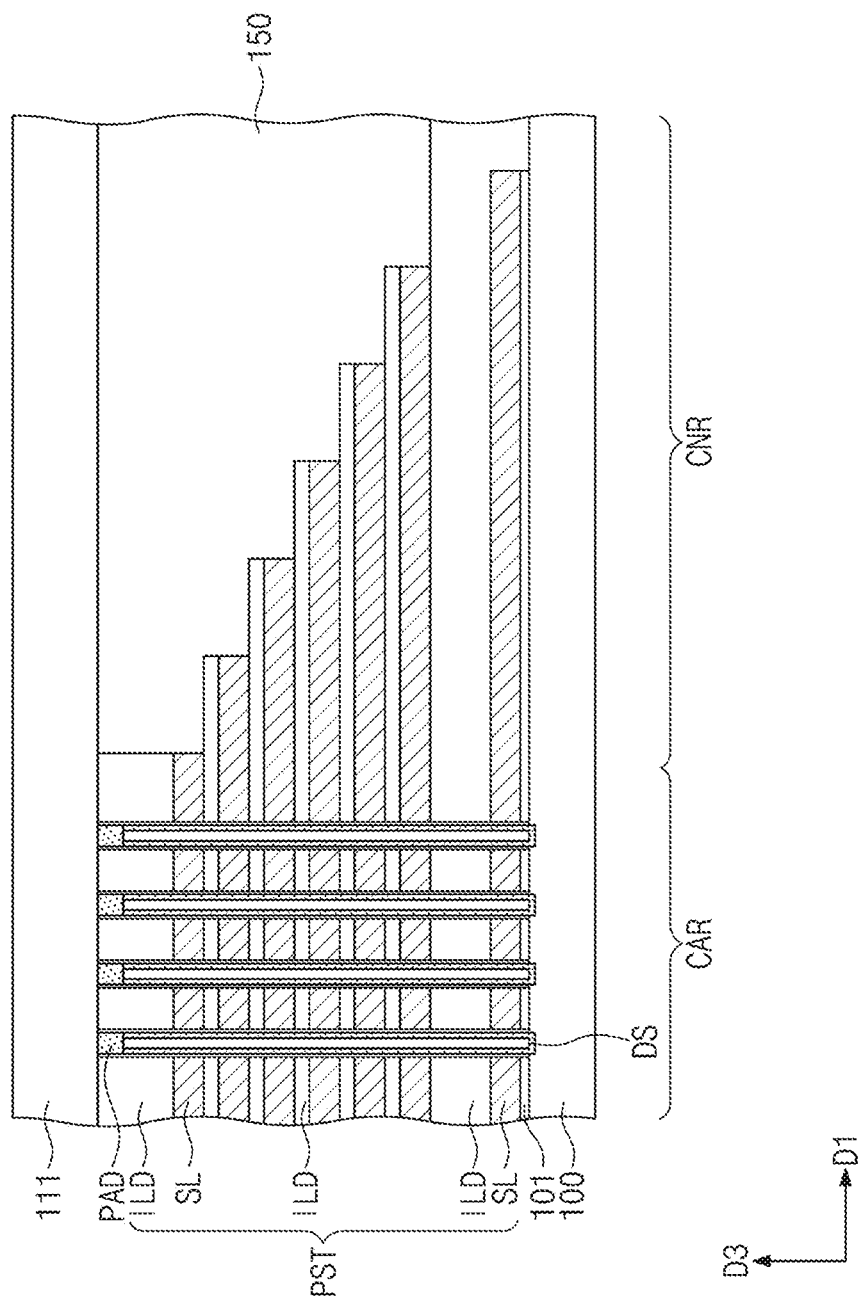

Referring to FIGS. 24, 25A, and 25B, the stacks ST may be formed by replacing the sacrificial layers SL with the electrodes EL. Each of the stacks ST may include the insulating layers ILD and the electrodes EL, which are vertically and alternately stacked. In detail, the sacrificial layers SL exposed through the trenches T may be selectively removed, and the electrodes EL may be formed in empty spaces, from which the sacrificial layers SL are removed. Before the forming of the electrodes EL, the horizontal insulating pattern HP may be conformally formed in the empty spaces, from which the sacrificial layers SL are removed (e.g., see FIG. 4A). The electrodes EL may be formed to completely fill the empty spaces, from which the sacrificial layers SL are removed.

Thereafter, the common source regions CSR may be formed by doping portions of the substrate 100, which are exposed between the sidewalls of the stacks ST, with impurities. The common source regions CSR may be formed to have a different conductivity type from the substrate 100.

Figure 26:
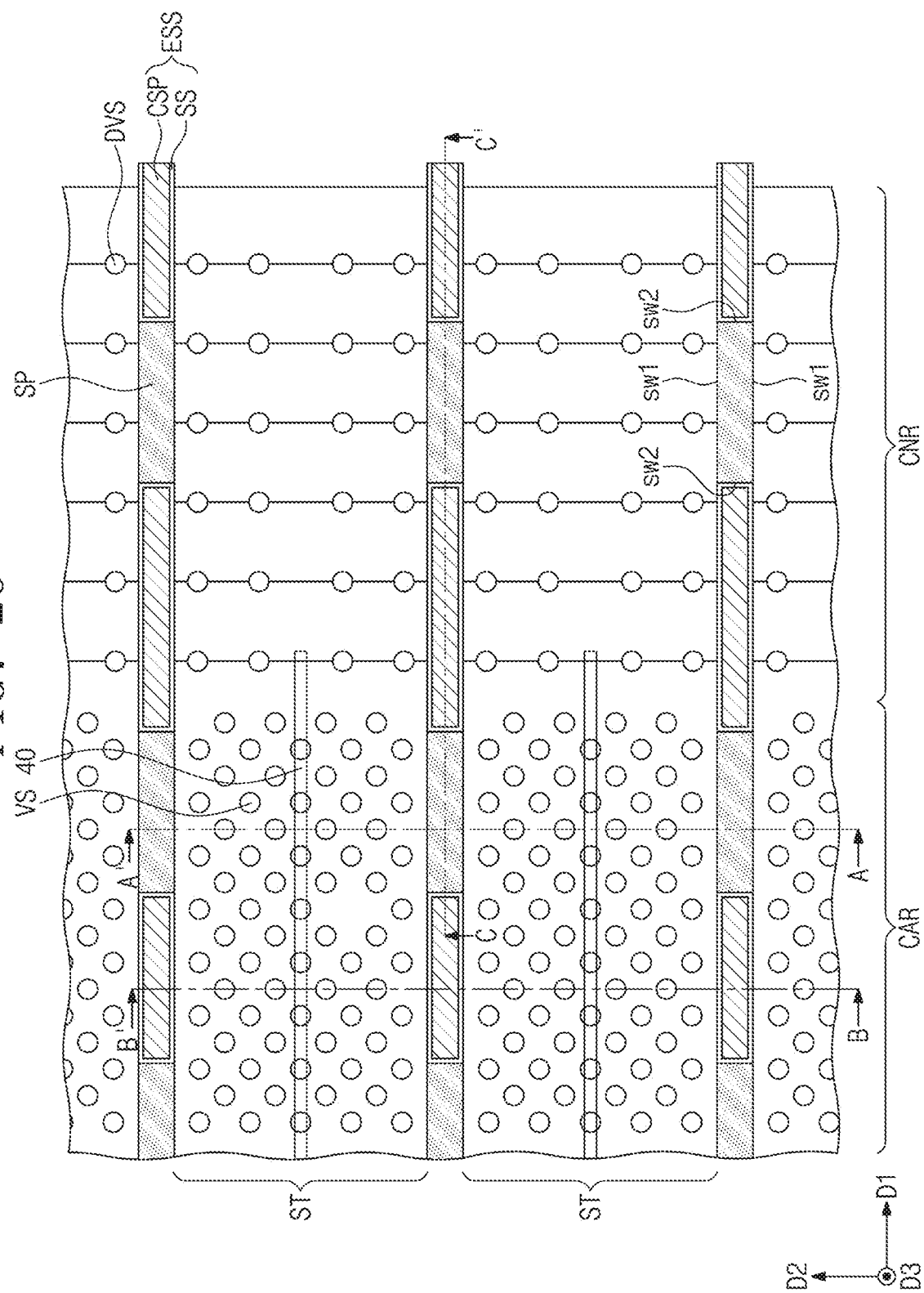
Figure 27A:
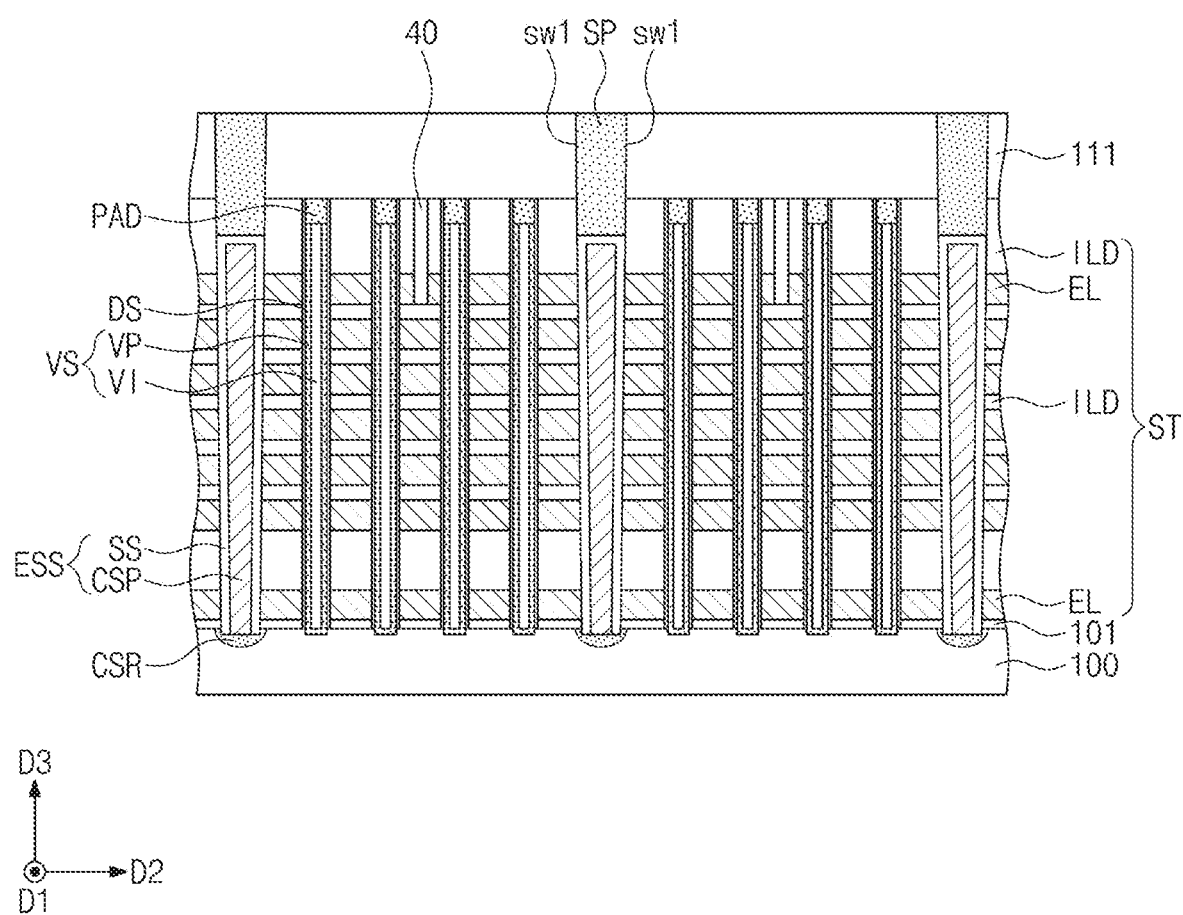
Figure 27B:
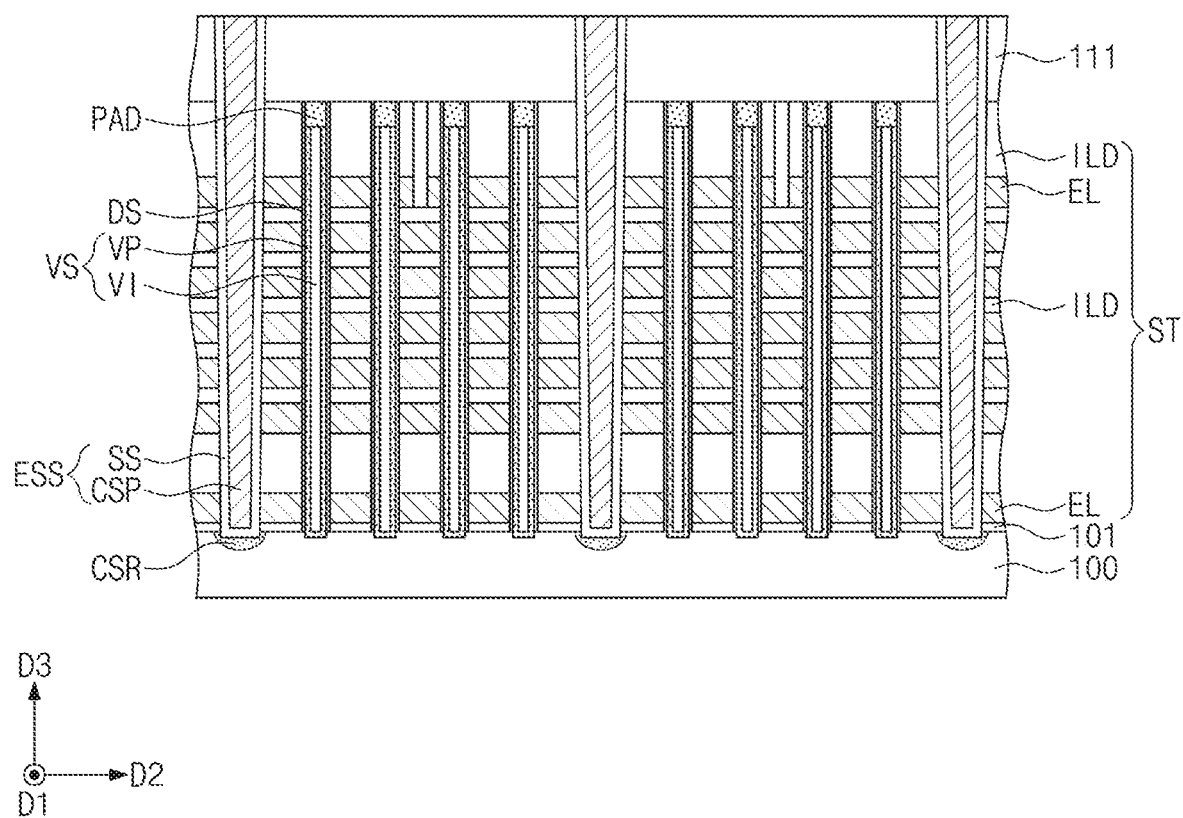
Figure 27C:
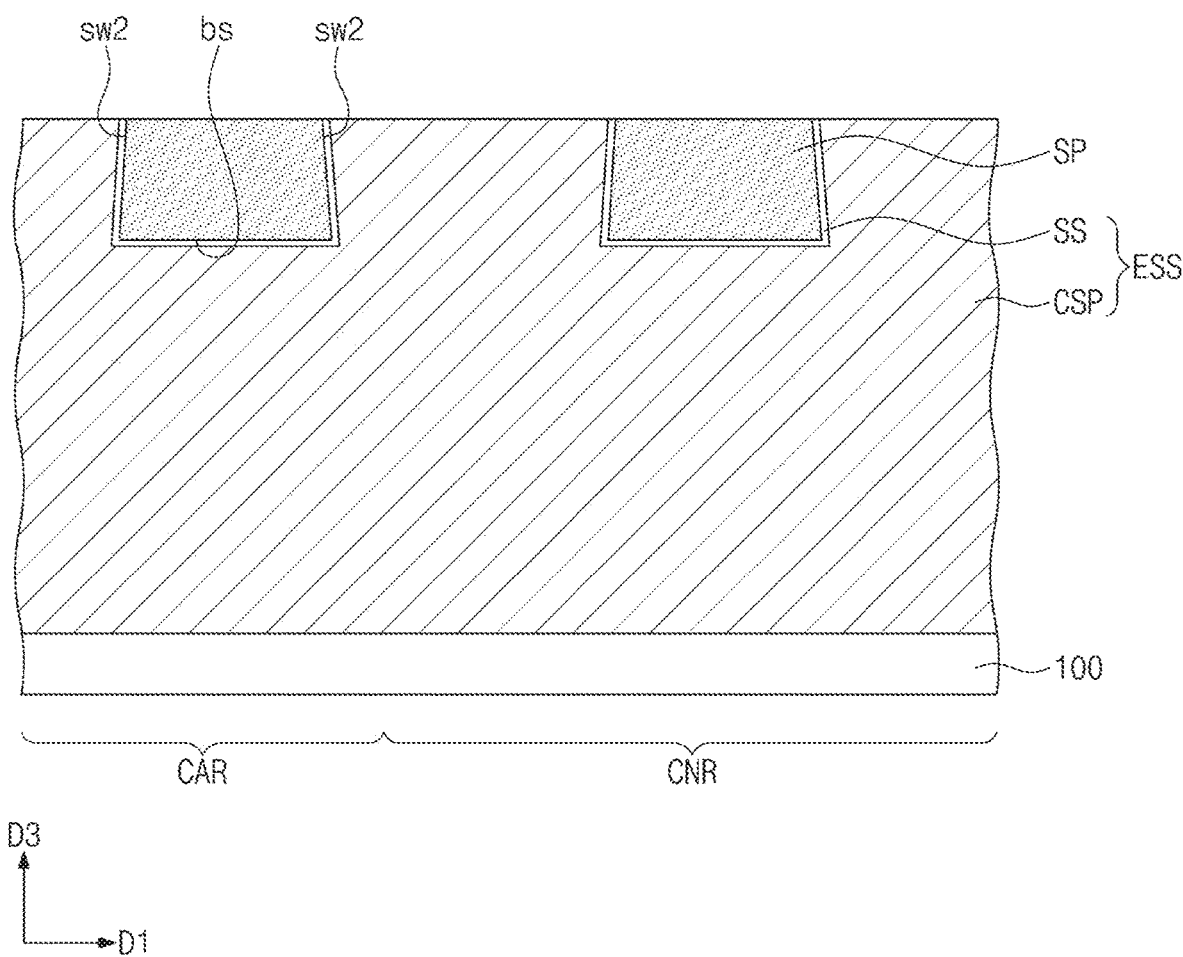

Referring to FIGS. 26, 27A, and 27B, the electrode separation structures ESS may be formed between the opposite sidewalls of the stacks ST. Each of the electrode separation structures ESS may include the common source plug CSP and the insulating spacer SS, which is interposed between the common source plug CSP and the sidewalls of the stacks ST.

The insulating spacer SS may be formed to cover the opposite sidewalls of the stacks ST. A bottom surface of the insulating spacer SS may be etched to expose the top surface of the substrate 100. The common source plug CSP may be formed to fill a remaining space of the trench T, in which the insulating spacer SS is formed. The common source plug CSP may be extended in the first direction D1 and may be coupled to the common source region CSR of the substrate 100. A planarization process may be performed such that the common source plug CSP has a top surface coplanar with the top surface of the support pattern SP.

Referring back to FIGS. 2, 3A, 3B, and 3D, the second interlayered insulating layer 112 may be formed on the first interlayered insulating layer 111 to cover the top surfaces of the electrode separation structures ESS and the top surfaces of the support patterns SP. The bit line contact plugs BPLG may be formed on the cell array region CAR to penetrate the first interlayered insulating layer 111 and the second interlayered insulating layer 112 and to be coupled to the conductive patterns PAD. The bit lines BL may be formed on the second interlayered insulating layer 112.

Cell contacts CP may be formed on the connection region CNR to penetrate the first interlayered insulating layer 111, the second interlayered insulating layer 112, and the insulating planarization layer 150 and to be coupled to the electrodes EL of the stacks ST. The connection lines CL may be formed on the second interlayered insulating layer 112.

According to some embodiments of the inventive concepts, a support pattern may be provided between opposite sidewalls of stacks facing each other. Accordingly, it may be possible to prevent a leaning issue in the stacks and to realize a three-dimensional semiconductor device with improved reliability.

While some example embodiments of the inventive concepts have been particularly shown and described, it will be understood by one of ordinary skill in the art that variations in form and detail may be made therein without departing from the scope of the attached claims.

What is claimed is:

1. A three-dimensional semiconductor device, comprising:
    first and second stacks separated from each other in a first direction, each of the first and second stacks comprising electrodes vertically stacked on a substrate;
    vertical channel structures that penetrate the electrodes and are connected to the substrate;
    an interlayered insulating layer on top surfaces of the vertical channel structures; and
    a support pattern located between opposite sidewalls of the first and second stacks, in the interlayered insulating layer,
    wherein a bottom surface of the support pattern is positioned at a higher level than a top surface of an uppermost electrode of the electrodes, and
    wherein a width of the support pattern decreases with increasing distance from the substrate, when measured in a second direction perpendicular to the first direction.

2. The three-dimensional semiconductor device of claim 1, wherein a width of the support pattern in the first direction increases with increasing distance from the substrate.

3. The three-dimensional semiconductor device of claim 1, wherein each of the first and second stacks further comprises insulating layers,
    wherein the electrodes and the insulating layers are alternately stacked, and
    wherein the support pattern is in direct contact with an uppermost insulating layer of the insulating layers located on the top surface of the uppermost electrode.

4. The three-dimensional semiconductor device of claim 1, further comprising a bit line electrically connecting the vertical channel structures to each other, wherein a top surface of the support pattern is positioned at a level lower than a bottom surface of the bit line.

5. The three-dimensional semiconductor device of claim 1, further comprising an electrode separation structure between the first and second stacks and in contact with bottom and side surfaces of the support pattern.

6. The three-dimensional semiconductor device of claim 5, wherein a width of a top surface of the support pattern in the first direction is equal to a width of a top surface of the electrode separation structure in the first direction.

7. The three-dimensional semiconductor device of claim 5, wherein a top surface of the support pattern is coplanar with a top surface of the electrode separation structure.

8. The three-dimensional semiconductor device of claim 1, further comprising an insulating separation pattern crossing the uppermost electrode in a second direction perpendicular to the first direction.

9. The three-dimensional semiconductor device of claim 1, wherein the support pattern is provided to define a recessed portion, which is recessed from its bottom surface toward its top surface.

10. A three-dimensional semiconductor device, comprising:
    first and second stacks extended in a first direction and spaced apart from each other in a second direction crossing the first direction, each of the first and second stacks comprising electrodes vertically stacked on a substrate;
    a plurality of support patterns, which are between opposite sidewalls of the first and second stacks and are arranged in the first direction, each of the support patterns comprising a first pair of opposing sidewalls and a second pair of opposing sidewalls; and
    an electrode separation structure between the first and second stacks and in contact with bottom surfaces of the support patterns and the first pair of opposing sidewalls of the support patterns,
    wherein the second pair of opposing sidewalls of the support patterns are aligned to sidewalls of the electrode separation structure, and
    wherein widths of the support patterns in the second direction increase with increasing distance from the substrate.

11. The three-dimensional semiconductor device of claim 10, wherein each of the first and second stacks further comprises insulating layers,
    wherein the insulating layers and the electrodes are alternately stacked, and
    wherein the second pair of opposing sidewalls of the support patterns are in direct contact with an uppermost insulating layer of the insulating layers located on a top surface of an uppermost electrode of the electrodes.

12. The three-dimensional semiconductor device of claim 10, wherein a bottom surface of the support patterns is positioned at a level higher than a top surface of an uppermost electrode of the electrodes.

13. The three-dimensional semiconductor device of claim 10, wherein the electrode separation structure comprises:
    a common source plug extended in the first direction between the first and second stacks and coupled to the substrate; and
    an insulating spacer between the common source plug and the opposite sidewalls of the first and second stacks.

14. The three-dimensional semiconductor device of claim 13, wherein a width of a top surface of the common source plug in the second direction is less than a width of a top surface of the support patterns in the second direction.

15. The three-dimensional semiconductor device of claim 10, wherein a bottom surface of the support patterns has a recessed shape and defines an air gap between the support patterns and the electrode separation structure.

16. A three-dimensional semiconductor device, comprising:
    a substrate including a cell array region and a connection region arranged in a first direction;
    first and second stacks each including electrodes and insulating layers are alternately stacked on the substrate, and each having a staircase structure on the connection region;
    vertical channel structures on the cell array region that penetrate the first and second stacks and are connected to the substrate;
    dummy vertical structures on the connection region that penetrate the first and second stacks;

an interlayered insulating layer on the vertical channel structures and the dummy vertical structures;

a bit line on the interlayered insulating layer and electrically connected to the vertical channel structures;

cell contacts on the connection region that penetrate the interlayered insulating layer, each cell contact coupled to a respective electrode;

support patterns located between opposite sidewalls of the first and second stacks, in the interlayered insulating layer; and an electrode separation structure in a region between the first and second stacks and in contact with bottom and side surfaces of the support patterns, wherein the support patterns have top surfaces, which are located at a level lower than a bottom surface of the bit line, and bottom surfaces, which are located at a level higher than a top surface of an uppermost electrode of the electrodes, and wherein the support patterns comprise a first support pattern between the vertical channel structures and a second support pattern between the cell contacts.

17. The three-dimensional semiconductor device of claim 16, wherein the first support pattern is in direct contact with an uppermost one of the insulating layers.

18. The three-dimensional semiconductor device of claim 16, wherein a width of the first support pattern in the first direction decreases with increasing distance from the substrate, and wherein a width of the first support pattern in a second direction increases with increasing distance from the substrate.

* * * * *